(12) United States Patent
de Buda

(10) Patent No.: US 7,940,039 B2
(45) Date of Patent: May 10, 2011

(54) TRANSFORMER METER AND SYSTEM FOR USING SAME

(76) Inventor: Eric de Buda, Toronto (CA)

( * ) Notice: Subject to any disclaimer, the term of this patent is extended or adjusted under 35 U.S.C. 154(b) by 101 days.

(21) Appl. No.: 12/172,112

(22) Filed: Jul. 11, 2008

(65) Prior Publication Data

US 2009/0066317 A1    Mar. 12, 2009

Related U.S. Application Data

(60) Provisional application No. 60/949,606, filed on Jul. 13, 2007.

(51) Int. Cl.
*G01R 19/00* (2006.01)
*G01R 7/00* (2006.01)
(52) U.S. Cl. ............. 324/103 R; 324/126; 324/127
(58) Field of Classification Search ............ None
See application file for complete search history.

(56) References Cited

U.S. PATENT DOCUMENTS

| | | | |
|---|---|---|---|
| 4,706,017 A * | 11/1987 | Wilson .............. | 324/127 |
| 4,783,748 A | 11/1988 | Swarztrauber et al. | |
| 4,794,327 A * | 12/1988 | Fernandes ............ | 324/126 |
| 6,549,120 B1 * | 4/2003 | de Buda ............. | 370/482 |
| 6,947,854 B2 | 9/2005 | Swarztrauber et al. | |
| 6,965,225 B2 * | 11/2005 | de Buda ............. | 324/117 R |
| 7,054,770 B2 | 5/2006 | Swarztrauber et al. | |
| 2003/0158677 A1 | 8/2003 | Swarztrauber et al. | |
| 2005/0137813 A1 | 6/2005 | Swarztrauber et al. | |
| 2005/0212505 A1 * | 9/2005 | Murray et al. ........ | 324/126 |
| 2006/0259254 A1 | 11/2006 | Swarztrauber et al. | |

FOREIGN PATENT DOCUMENTS

CA    2401579    9/2001

\* cited by examiner

*Primary Examiner* — Vinh P Nguyen
(74) *Attorney, Agent, or Firm* — Elias Borges

(57) ABSTRACT

A meter for recording voltage and current on a transformer has current sensors positioned on a housing such that the meter can be mounted to the terminals of the transformer. The device also includes two voltage leads which can be attached to the transformers terminals. An instrumentation module is contained in the housing and is coupled to the current sensors and the voltage leads, the instrumentation module being adapted and configured to record voltage and current measurements from the current sensors and voltage leads. The instrumentation module includes a signal processing module for processing the voltage and current signals to provide other information such as energy and accumulated in-phase current data. Finally, the device includes a communications module coupled to the instrumentation module for communicating the voltage and current measurements and the derived data to a remote user.

23 Claims, 22 Drawing Sheets

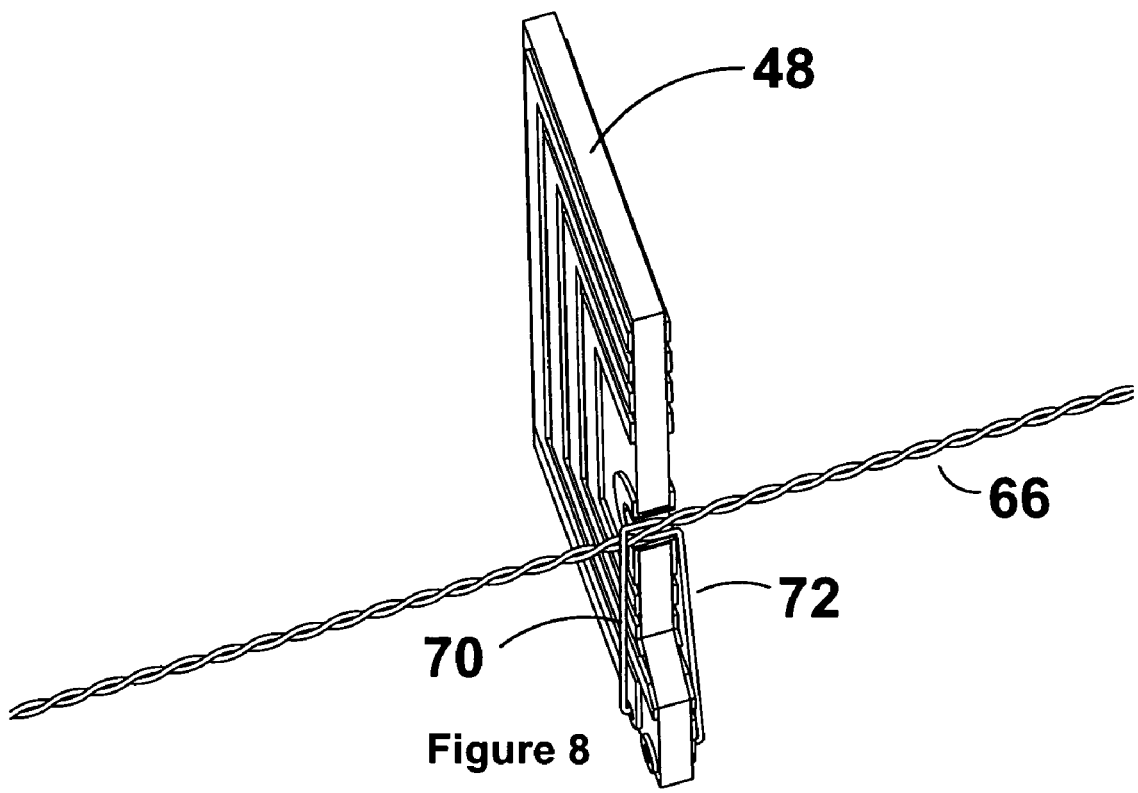
Figure 8
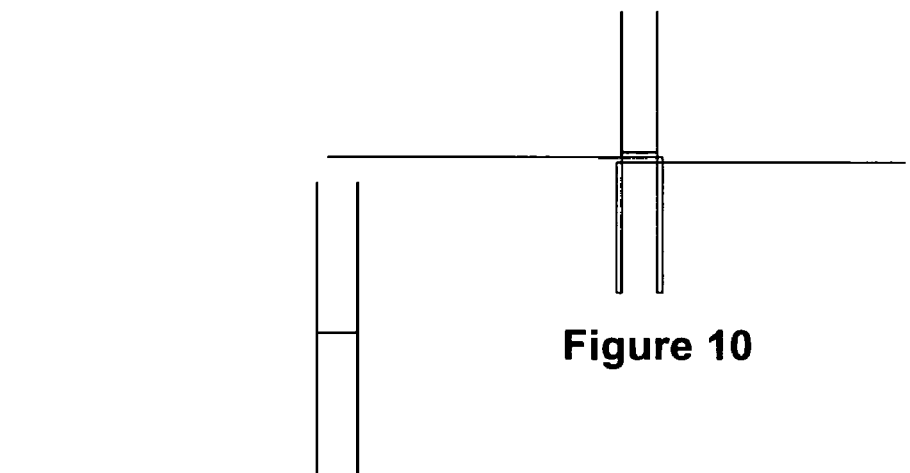
Figure 10
Figure 9

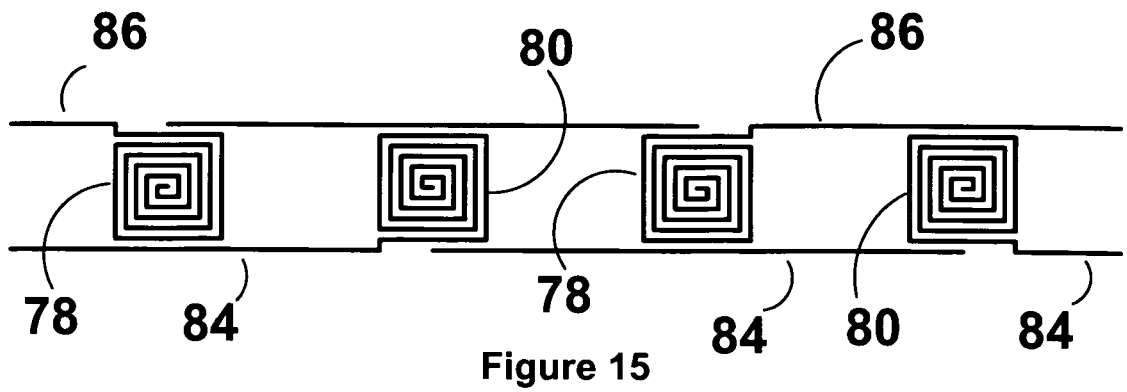
Figure 15
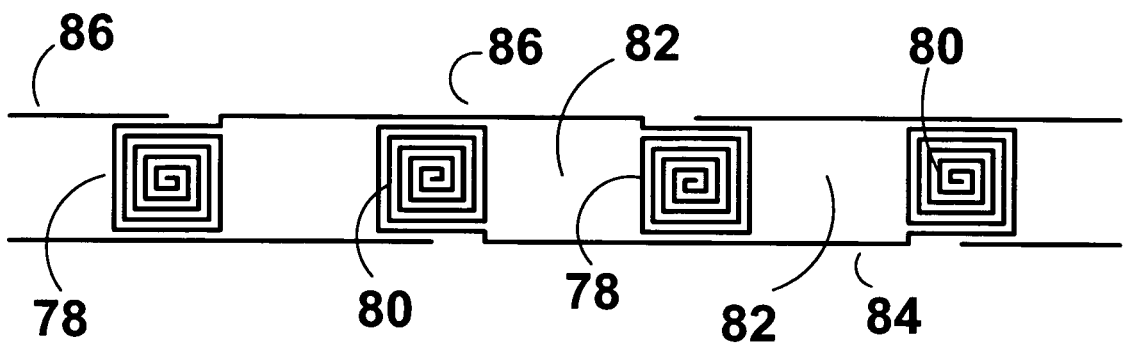
Figure 16
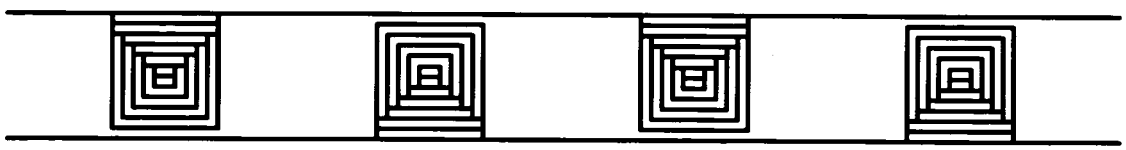

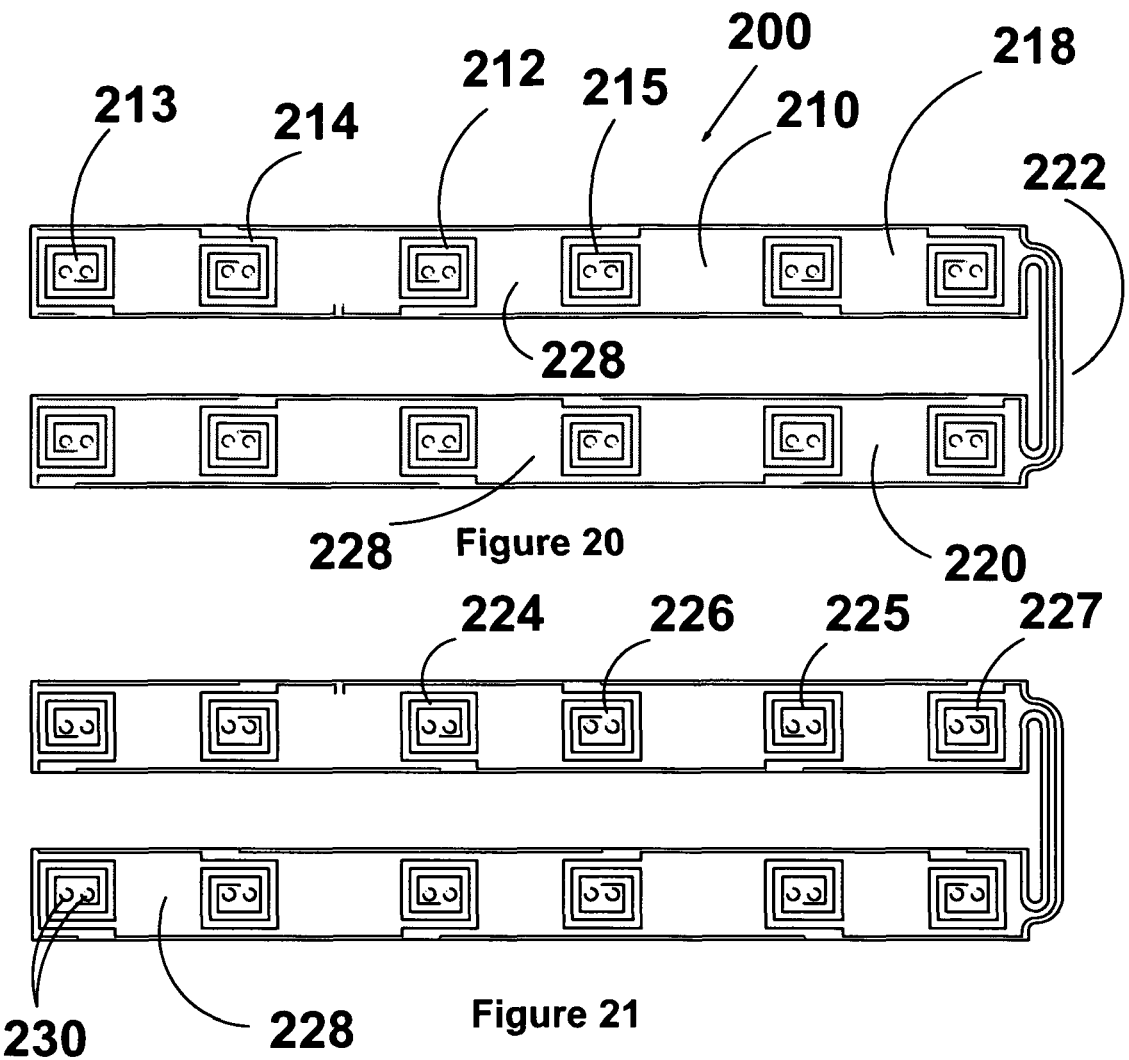
Figure 20
Figure 21
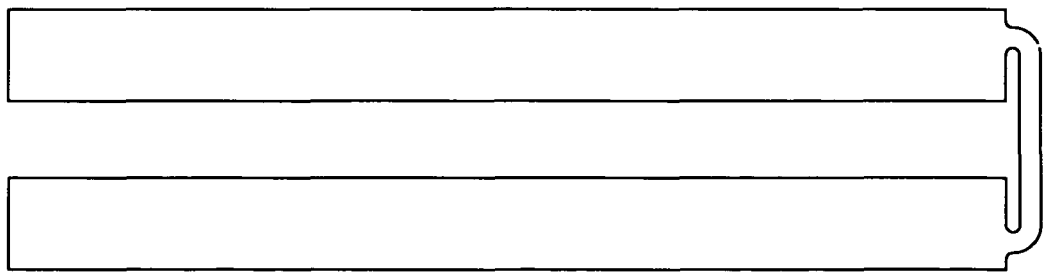
Figure 22

TRANSFORMER METER AND SYSTEM FOR USING SAME

CROSS REFERENCE TO RELATED APPLICATION

This application claims priority from US provisional patent application Ser. No. 60/949,606 filed Jul. 13, 2007, the entirely of which is incorporated herein by reference.

FIELD OF THE INVENTION

The invention relates generally to transformer meters for recording voltage and current measurements and other data from the transformer and transmitting same to a remote user.

BACKGROUND OF THE INVENTION

Distribution transformer meters have been used to monitor the condition of distribution transformers and to measure the electrical energy being consumed by loads coupled to the distribution transformer. Traditionally, the meters used to monitor distribution transformers have been bulky devices incorporating either solid core or split core current sensors coupled to an instrumentation module. While solid core and split core current sensors have been used to reliably measure current, they are prone to errors resulting from the non-linear characteristics of ferromagnetic cores, improper installation and noise. As a result, highly precise current monitoring of distribution transformers has not always been possible. Distribution transformer meters which do not have the ability of accurately measuring current to high levels of precision are not often required, particularly where only the condition of the transformer is being monitored. However, if the distribution transformer is being monitored with a view of accurately and precisely measuring the electrical energy being used by loads coupled to the transformer, then an improved meter is required. In particular, a distribution transformer meter having much higher precision is required where the meter is to be used in a system for measuring and accounting for electrical energy (power) losses in a network. Furthermore there is a perceived need for a distribution transformer meter which can be quickly installed without the need to interrupt power.

SUMMARY OF THE INVENTION

In accordance with one aspect of the present invention, there is provided an improved meter for precisely measuring voltage and current and other data on a distribution transformer, the meter being both easy to install and highly accurate. The meter includes a housing having a body portion and a lever portion, the lever portion being movably connected to the body portion and movable between a closed position wherein the lever portion abuts the body portion and an open position wherein the lever portion is positioned away from the body portion. The meter includes first and second current sensors each divided into two corresponding sensor fractions with one fraction of each sensor formed on the body portion of the housing and the other corresponding fraction of each sensor formed on the lever portion of the housing. The fractions of the first and second current sensors are configured such that each of the first and second current sensors have a central opening dimensioned to receive a terminal of the transformer when the lever portion of the housing is in its first position. The first and second current sensors are also positioned on the housing such that the meter can be mounted to the terminals of the transformer with the first current sensor receiving one terminal of the transformer and the second current sensor receiving another terminal of the transformer. The meter also includes first and second voltage leads mountable to X1 and X3 terminals of the transformer secondary circuit and an instrumentation module coupled to the current sensors and the voltage leads, said instrumentation module adapted and configured to record voltage and current measurements from the current sensors and voltage leads. Finally, meter includes a communications module coupled to the instrumentation module for communicating the voltage and current measurements to a remote user.

In accordance with another aspect of the invention, there is provided an improved meter for measuring voltage and current on a transformer with a high degree of accuracy and precision. The meter includes a housing and first and second clamp-on current sensors mountable to the terminals of the transformer. The first and second current sensors each comprise a first and second set of planar coils radiating from the central opening, the planar coils being positioned with substantial radial symmetry about the central axis of the central opening. The coils are electrically interconnected in each current sensor such that the output voltages of said coils are combined and applied to output terminals of the current sensor. The first and second sets of planar coils are electrically interconnected in a first and second circuit, respectively, the first and second coils being interleaved, the first circuit being coupled to a positive input on a differential amplifier and the second circuit being coupled to a negative input on the differential amplifier. The meter further includes first, and second voltage leads, mountable to the transformer terminals and an instrumentation module coupled to the current sensors and the voltage leads. The instrumentation module is adapted and configured to record voltage and current measurements from the current sensors and voltage leads. The meter also includes a communications module coupled to the instrumentation module for communicating the voltage and current measurements to a remote user.

In accordance with another aspect of the invention, there is provided a meter for measuring voltage and current on a transformer, the meter including a housing, first and second clamp-on current sensors and first, and second voltage leads. The meter further includes an instrumentation module coupled to the current sensors and the voltage leads. The instrumentation module is adapted and configured to record voltage and current measurements from the current sensors and voltage leads over an interval of time. The instrumentation module is further configured to record an accumulated in-phase current or AIPC measurement by sampling the current with a sample rate which is much higher than the power system frequency of 60 Hz, and multiplying each value by the corresponding value of a pure sinusoidal waveform, said sinusoidal waveform having the same phase and frequency as the voltage waveform and a root-mean-squared amplitude of one, taking the sum of the products and dividing by the sampling frequency. The meter also includes a communications module coupled to the instrumentation module for communicating the voltage measurements, the current measurements and the AIPC measurement to a remote user.

In accordance with another aspect of the invention, there is provided a method for using a meter capable of recording and transmitting AIPC measurements as described in the previous paragraph for monitoring an electrical distribution network. The distribution network includes a feeder transformer coupled to at least one feeder line, the feeder line being in turn coupled to a plurality of distribution transformers, each distribution transformer being in turn coupled to a load. Each distribution transformer in the network is coupled to a meter capable of recording AIPC as defined in the previous paragraph. The method includes the steps of recording the AIPC at each of the distribution transformers for a time period, wherein AIPC equals the integral of the in-phase current, recording a feeder AIPC at the feeder current meter of the electrical current passing through the feeder meter, multiplying each AIPC value by its corresponding nominal voltage to determine an normalized active energy (NAE) value for each AIPC value and then comparing the sum of the NAE values derived from the distribution transformers to the feeder NAE value.

With the foregoing in view, and other advantages as will become apparent to those skilled in the art to which this invention relates as this specification proceeds, the invention is herein described by reference to the accompanying drawings forming a part hereof, which includes a description of the preferred typical embodiment of the principles of the present invention.

DESCRIPTION OF THE DRAWINGS

FIG. 8 is a perspective view of the PCB coil component shown in FIG. 7 with the planar coil partly cut away to show details of how the twisted pair wires is connected to the PCB supporting the planar coil.

FIG. 9 is a line drawing which shows the current path along a plane which is at right angles to the plane of the PCB coil which has been incorrectly wired.

FIG. 10 is a line drawing which shows the current path along a plane which is at right angles to the plane of the PCB coil which has been correctly wired.

FIG. 15 is a schematic view of the top layer tracing for a flexible circuit board for use in constructing the current sensor of the present invention.

FIG. 16 is a schematic view of the bottom layer tracing for a flexible circuit board for use in constructing the current sensor of the present invention.

FIG. 20 is a schematic view of the top layer tracing for an alternate flexible circuit board for use in constructing the current sensor of the present invention.

FIG. 21 is a schematic view of the bottom layer tracing for an alternate flexible circuit for use in constructing the current sensor of the present invention.

FIG. 22 is a top view of the outline for an alternate flexible circuit for use in constructing the current sensor of the present invention.

DETAILED DESCRIPTION OF THE INVENTION

Figure 1:
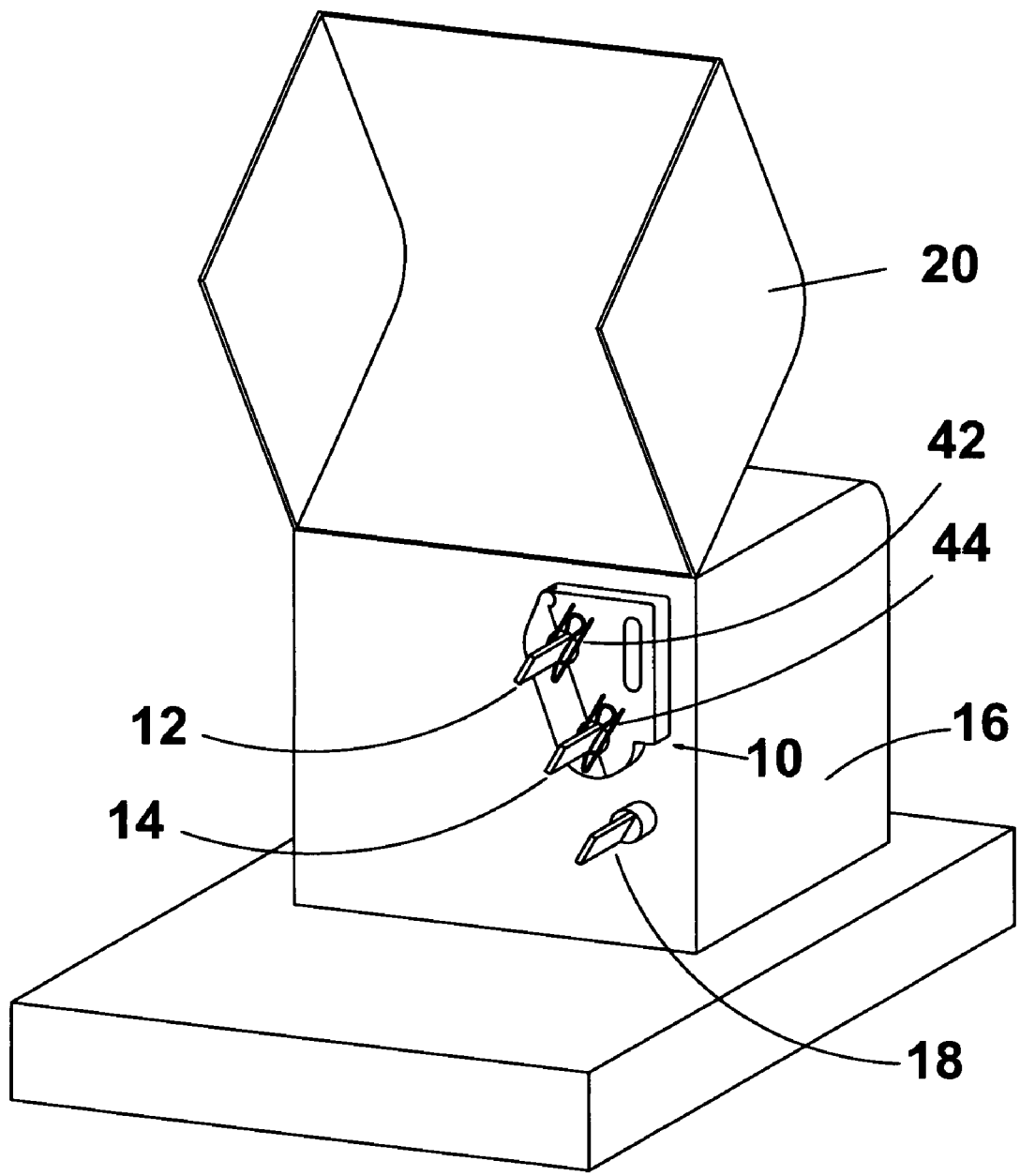
FIG. 1 is a perspective view of a transformer meter made in accordance with the present invention mounted in a pad type distribution transformer.
Figure 29:
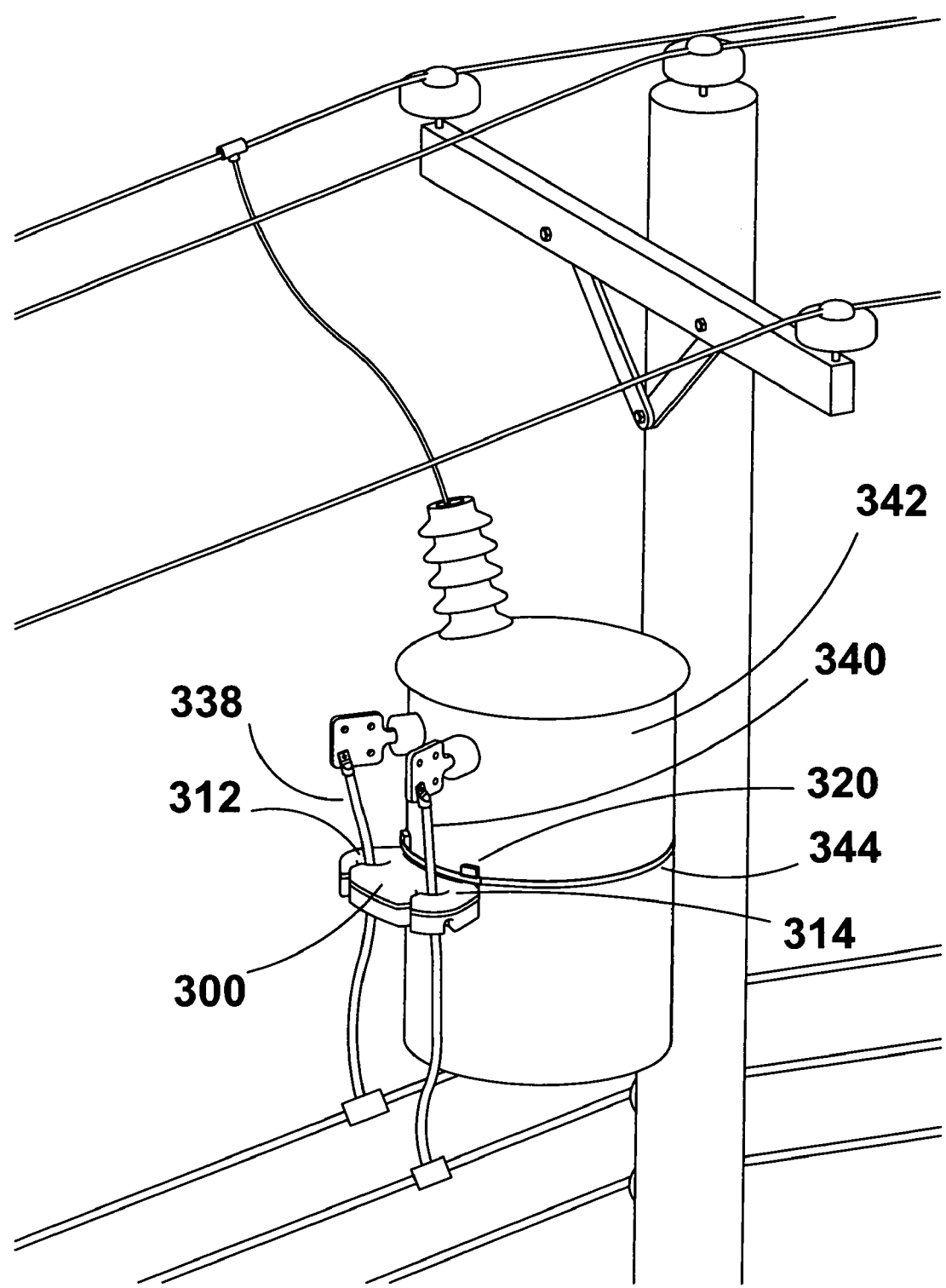
FIG. 29 is a perspective view of an alternate embodiment of the present invention showing how it would be mounted onto a pole mounted transformer In the drawings like characters of reference indicate corresponding parts in the different figures.

Referring firstly to FIG. 1, the present invention comprises, in part, an improved distribution transformer meter, shown generally as item 10, which is configured to be mounted to terminals 12 and 14 of distribution transformer 16 and which is further configured to record voltage, current, temperature, energy and AIPC measurements from the transformer and to communicate those measurements to a remote user, not shown. Transformer 16 is a distribution transformer, which may be either a pad mounted transformer, as illustrated in FIG. 1, or a pole mounted distribution transformer as illustrated in FIG. 29. The present invention is well suited for use with pad mounted distribution transformers but can be modified for use on pole mounted transformers as well. Pad mounted distribution transformer 16 will have terminals 12 and 14 representing the X1 and X3 terminals, and a neutral (X2) terminal 18. Cover 20 is provided on transformer 16 to protect the terminals against the elements.

Figure 11:
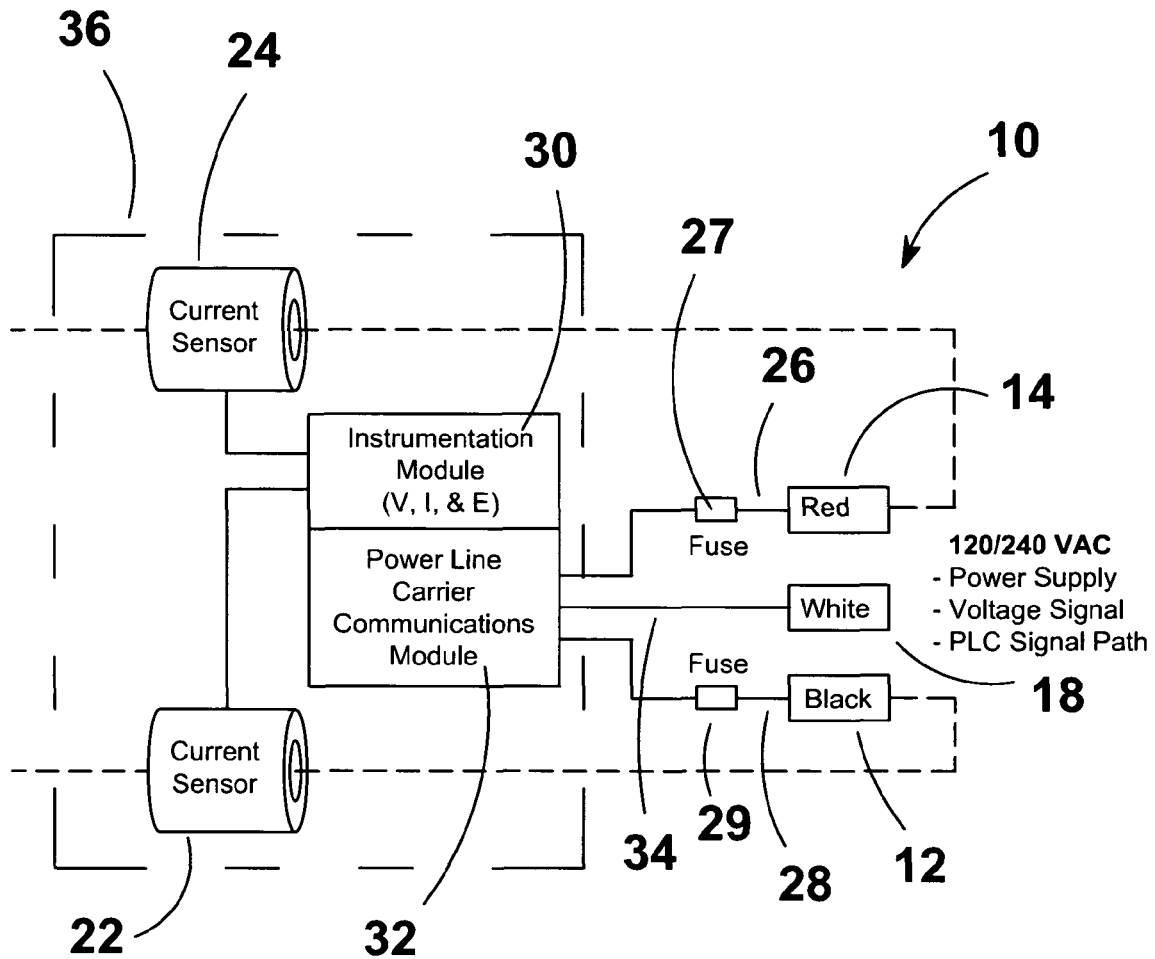
FIG. 11 is a schematic diagram showing the component parts of the transformer meter made in accordance with the present invention.

Referring now to FIG. 11, transformer meter 10 includes a pair of current sensors 22 and 24, voltage leads 26 and 28, instrumentation module 30 coupled to the current sensors and the voltage leads and communications module 32 coupled to the instrumentation module. Voltage leads 26 and 28 are coupled to class CC fuses 27 and 29 in order to provide protection against electrical faults. Leads 26 and 28 can be electrically coupled to secondary terminals 14 and 12 (X1 and X3 terminals) of the distribution transformer. The meter may optionally include a third electrical lead 34 which can be coupled to the neutral terminal 18. If this third lead is not present, then only one of fuses 27 and 29 is required. In a preferred embodiment of the present invention, current sensors 22 and 24 and modules 30 and 32 can be contained in a housing 36 which is illustrated schematically in FIG. 11. Current sensors 24 and 22 are preferably "clamp on" type current sensors which can be clamped onto the terminals of the transformer without requiring the dismantling of any cables (not shown) connected to terminals 12 and 14 or without the disruption of service. Several "clamp on" type current sensors are currently available on the marketplace which may be used with the present invention; however, as more particularly explained later on, current sensors 22 and 24 are preferably modified coreless current sensors similar to the coreless current sensors disclosed in U.S. Pat. No. 6,965,225 to de Buda, the entirety of which is incorporated herein by reference.

Figure 14:
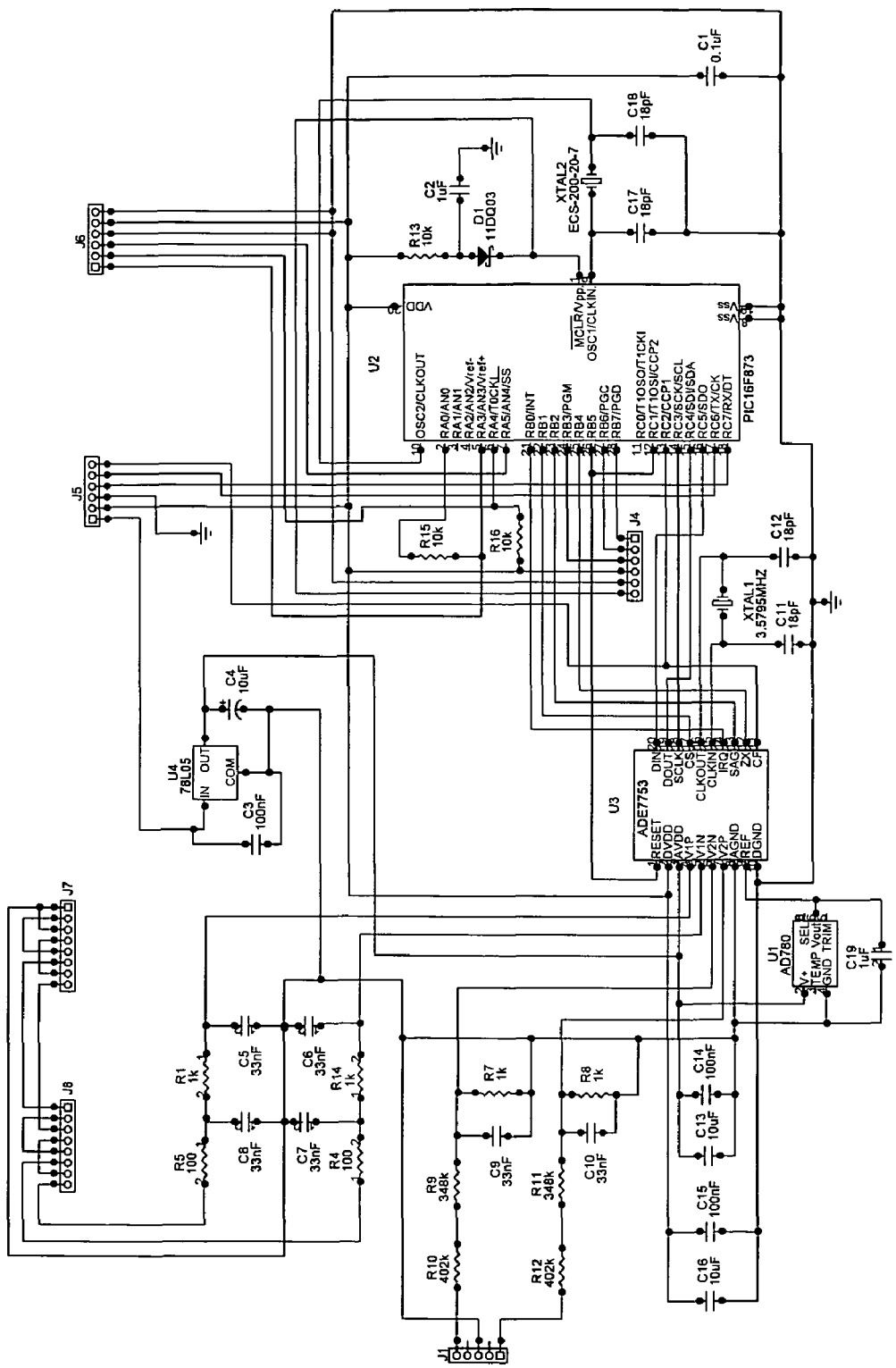
FIG. 14 is a circuit schematic of the instrumentation module portion of a transformer meter made in accordance with the present invention.

The instrumentation module contains the burden resistors for the current sensors if conventional iron-core current sensors are used. Otherwise, if the above mentioned coreless current sensor is used, the instrumentation module would instead have a special integrator. The instrumentation module also contains resistive dividers for measuring the voltage from the leads and the necessary electronic circuitry for processing the voltage and current input signals. For each time period, the instrumentation module measures maximum voltage, minimum voltage, maximum current, total energy supplied to the load and the integrated in-phase current, otherwise known as Accumulated In-Phase Current or AIPC, supplied to the load. The AIPC measurement is equal to the integral of the in-phase current, wherein the in-phase current is that component of the current that has the same phase as the voltage. Hence, in addition to the total energy supplied to the load, the meter can measure the total AIPC supplied to the load. The instrumentation function can be readily handled by an integrated circuit chip such as the ADE7753 available from Analog Devices as shown in FIG. 14, which illustrates how the instrumentation module is constructed. In a preferred embodiment, higher accuracy can be achieved if the voltage input to the ADE7753 is provided with a pure sinusoidal waveform having a root-mean-squared amplitude of one and having the same phase and frequency as the actual voltage waveform. If, as shown in FIG. 14, the actual voltage waveform is provided to the ADE7753, then software is needed to correct for this by dividing the sampled incremental energy values by the measured voltage.

Referring to FIG. 14, U2 is a programmable computer containing a CPU, flash memory and a communications interface. Connectors J7 and J8 are coupled to the current sensors, while the voltage leads are coupled to connector J1. An optional temperature sensor (not shown) for measuring the temperature of the transformer may be coupled to connector J6. Connector J4 provides a serial port for programming U2 and connector J5 is coupled to the communications module. Data stored in U2 is sent to the communications module which transmits the data to a remote data collector (not shown). Several suitable devices are readily available in the market which can be used for the communications module, including telephone line modems, cellular phone devices, wireless LAN devices and the like. Preferably, the communications module comprises a power line carrier communications module which transmits the data to a remote data collector via the power lines coupled to the transformer itself. Such a power line carrier communications device is disclosed in U.S. Pat. No. 6,549,120 to de Buda, the entirety of which is incorporated herein by reference. The voltage leads serve as a signal path for the power line carrier signals. In addition, the voltage leads allow voltage measurements and also supply power to the unit, permitting the unit to operate without the need for batteries.

Figure 2:
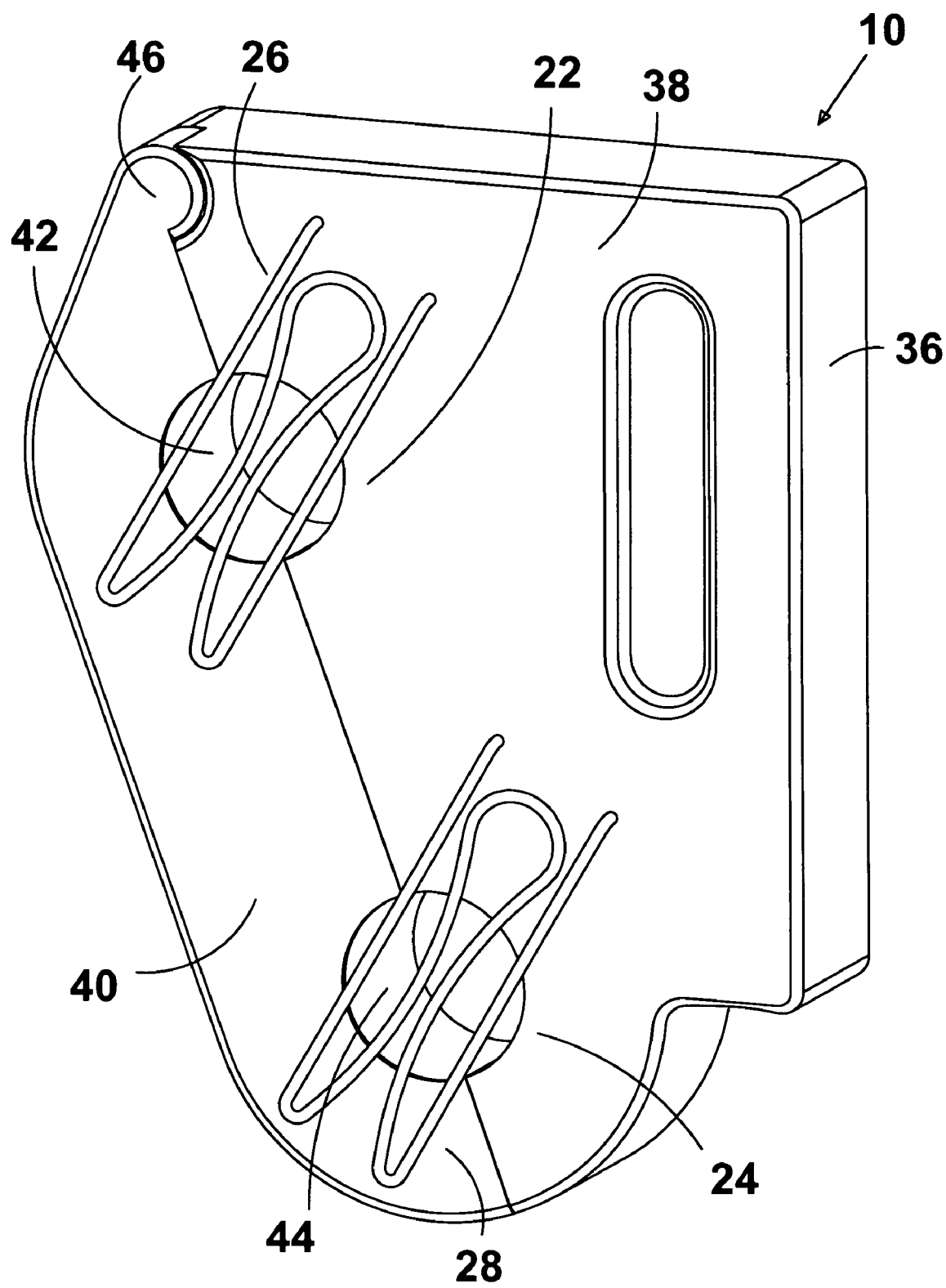
FIG. 2 is a perspective view of a transformer meter made in accordance with the present invention in its closed orientation.
Figure 3:
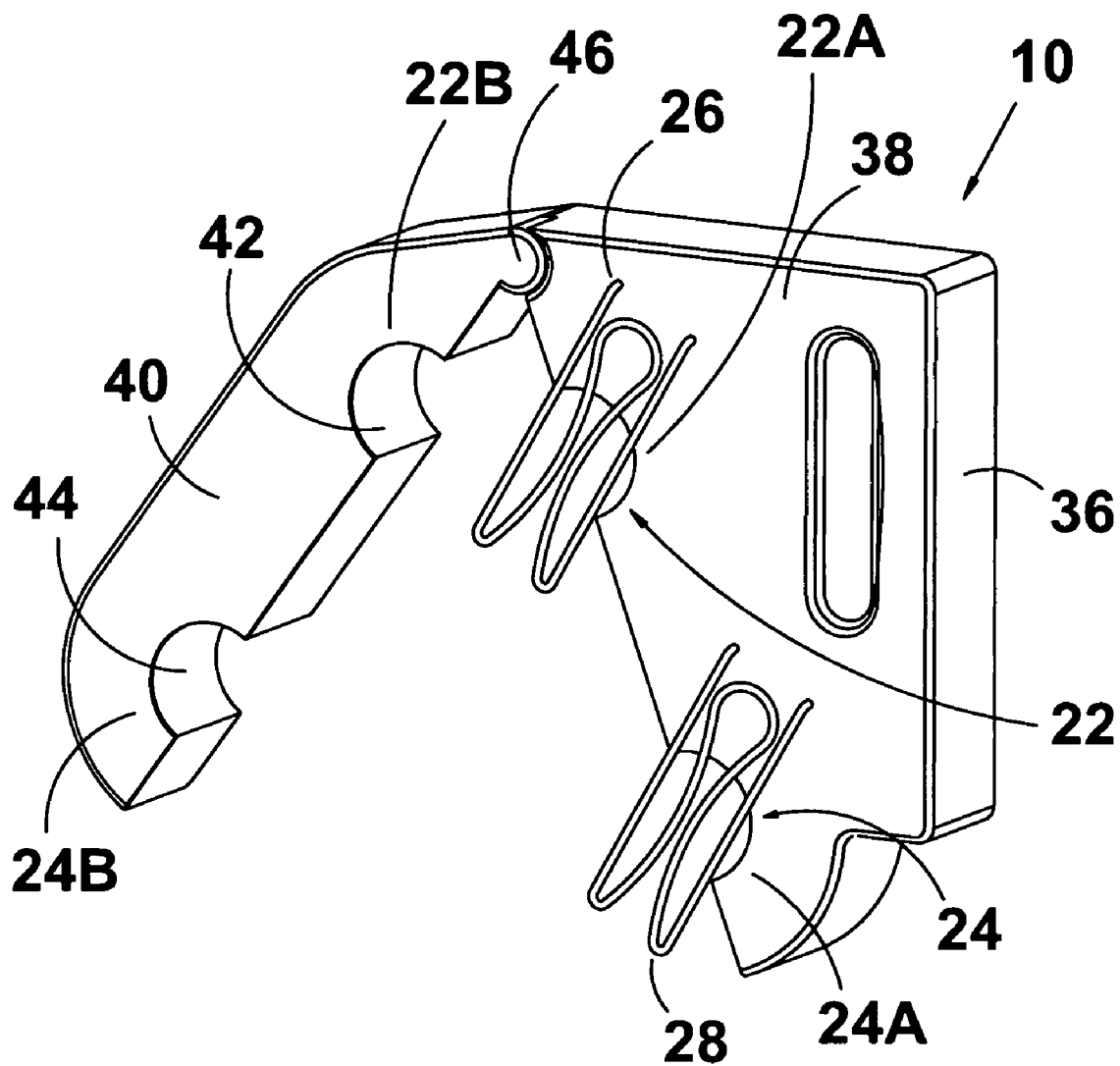
FIG. 3 is a perspective view of a transformer meter made in accordance with the present invention in its open orientation.

The instrumentation module is programmed to measure and record both the voltage across and the current passing through the transformer over a given time interval. The instrumentation module measures the voltage and current and continuously calculates power by multiplying the voltage and current. The instrumentation module calculates the total electrical energy transmitted through the transformer which is equal to the average power multiplied by the length of the programmed time period for the recordings. The time period can be any time period but will usually be 15 minutes, 30 minutes or one hour. In addition to these recordings, the instrumentation module will record a maximum voltage and a minimum voltage observed during the time period as well as a maximum current observed during the time period. Furthermore, the instrumentation module will be programmed to calculate an AIPC measurement over the time period which equals the integral of the in-phase current. The meter sends an information packet to the remote user after the end of each time period which contains the maximum and minimum recorded voltage, the maximum current, the total electrical energy transmitted during the time period and the total AIPC for the time period. Referring now to FIG. 2, the components of meter 10 are preferably contained within housing 36 which includes a body portion 38 and a lever portion 40 which is movably mounted to body portion 38 at joint 46. Lever portion 40 is movable between a closed position as shown in FIG. 2 wherein portion 40 abuts against portion 38 and an open position (see FIG. 3) where portion 40 is positioned away from portion 38. Current sensors 22 and 24 are formed on both body portion 38 and lever portion 40 around apertures 42 and 44. Electrical leads 26 and 28 are formed as clips which are positioned adjacent apertures 42 and 44, respectively. As better seen in FIG. 3, current sensors 22 and 24 are each formed as two fractions 22A, 22B and 24A, 24B, respectively. Fractions 22A and 24A are contained in body portion 38 and fractions 22B and 24B are contained in lever portion 40. Likewise, a portion of apertures 42 and 44 are formed on both lever portion 40 and body portion 38. Apertures 42 and 44 are dimensioned to receive terminals 12 and 14, respectively, of distribution transformer (see FIG. 1). Current sensors 22 and 24 are positioned adjacent to one another and spaced apart such that the sensor can be mounted directly to terminals 12 and 14 of the distribution transformer simply by positioning the current sensors over the terminals and then closing the housing.

Figure 4:
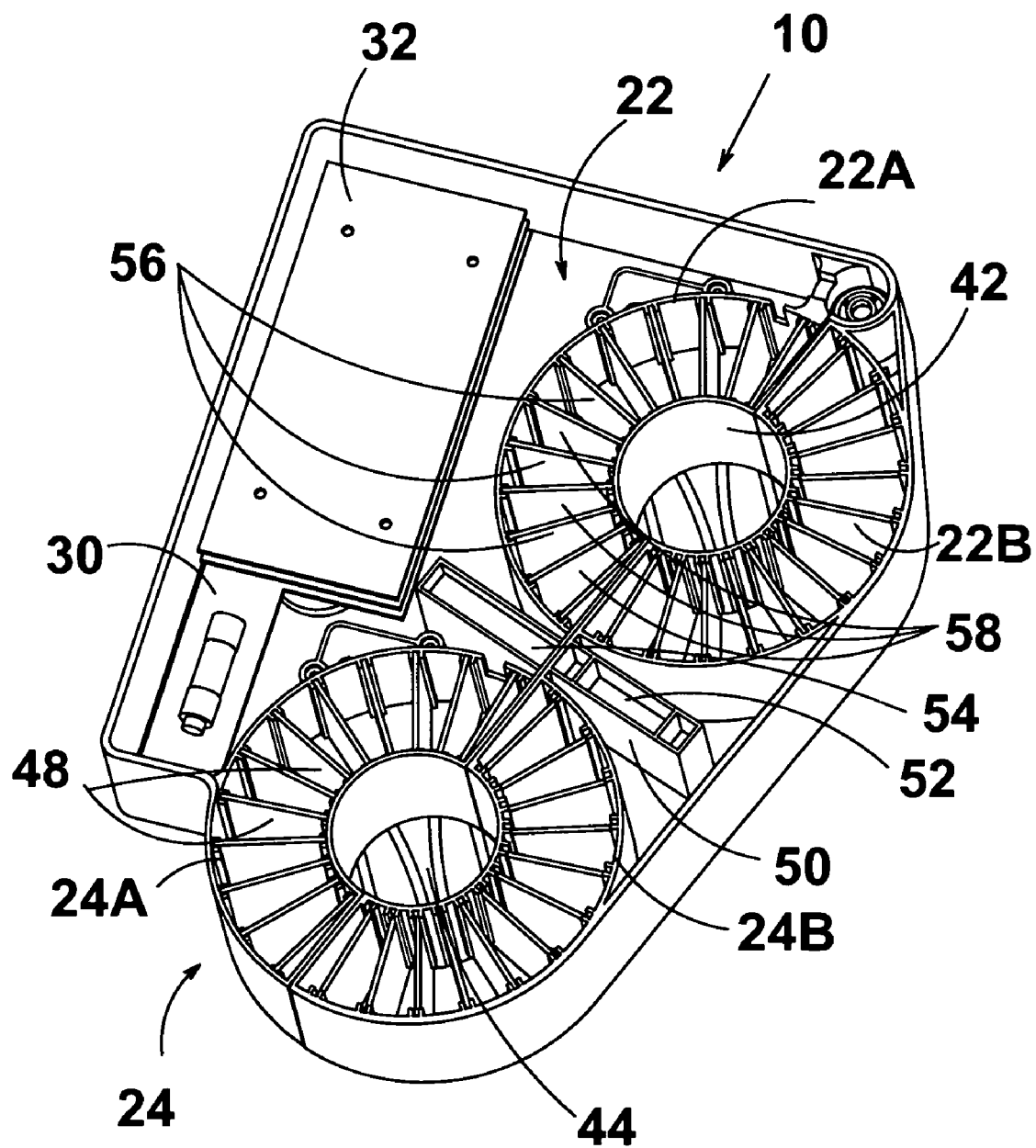
FIG. 4 is a perspective view of the transformer meter shown in FIG. 2 with part of its housing cut away to show details of the component parts of the meter.
Figure 5:
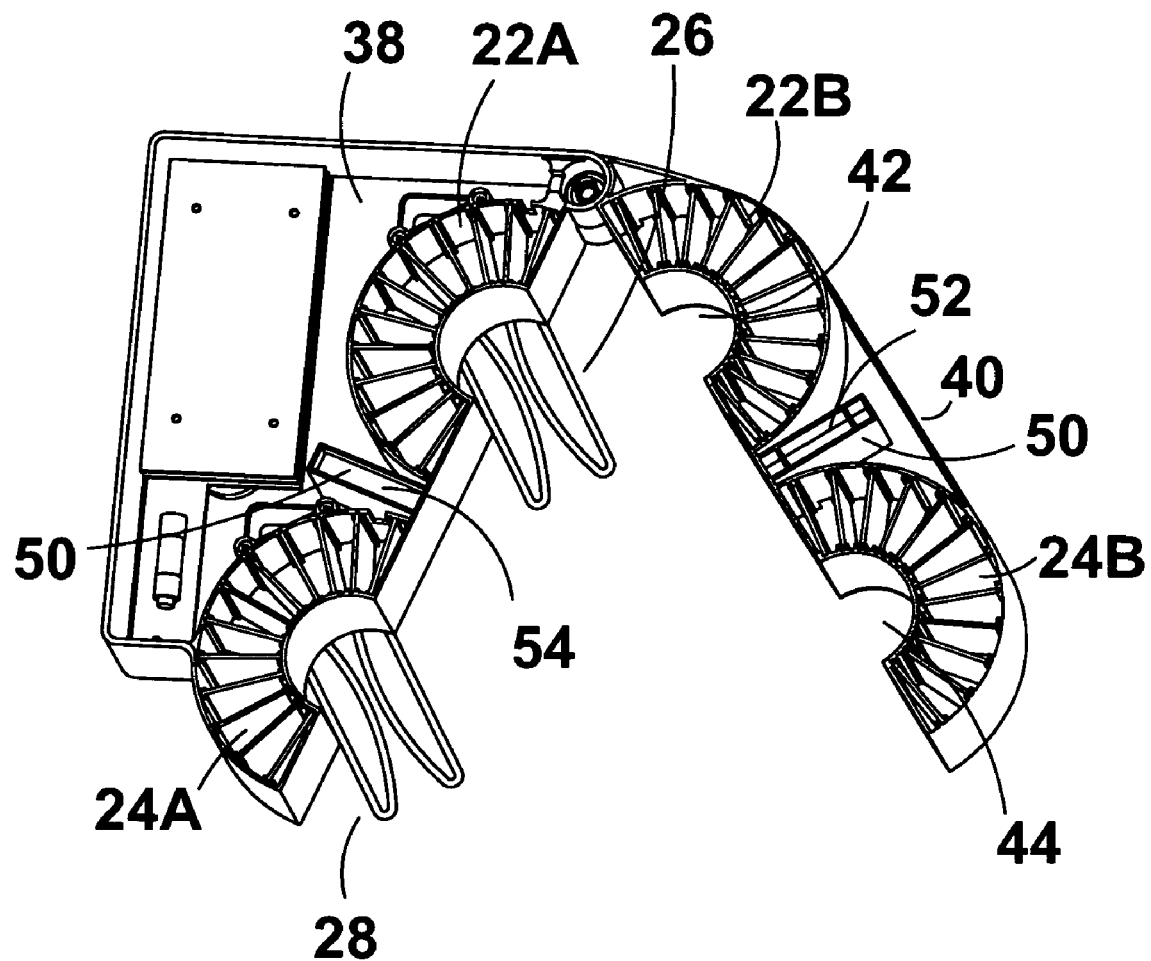
FIG. 5 is a perspective view of the transformer meter shown in FIG. 3 with part of its housing cut away to show details of the component parts of the meter.
Figure 18:
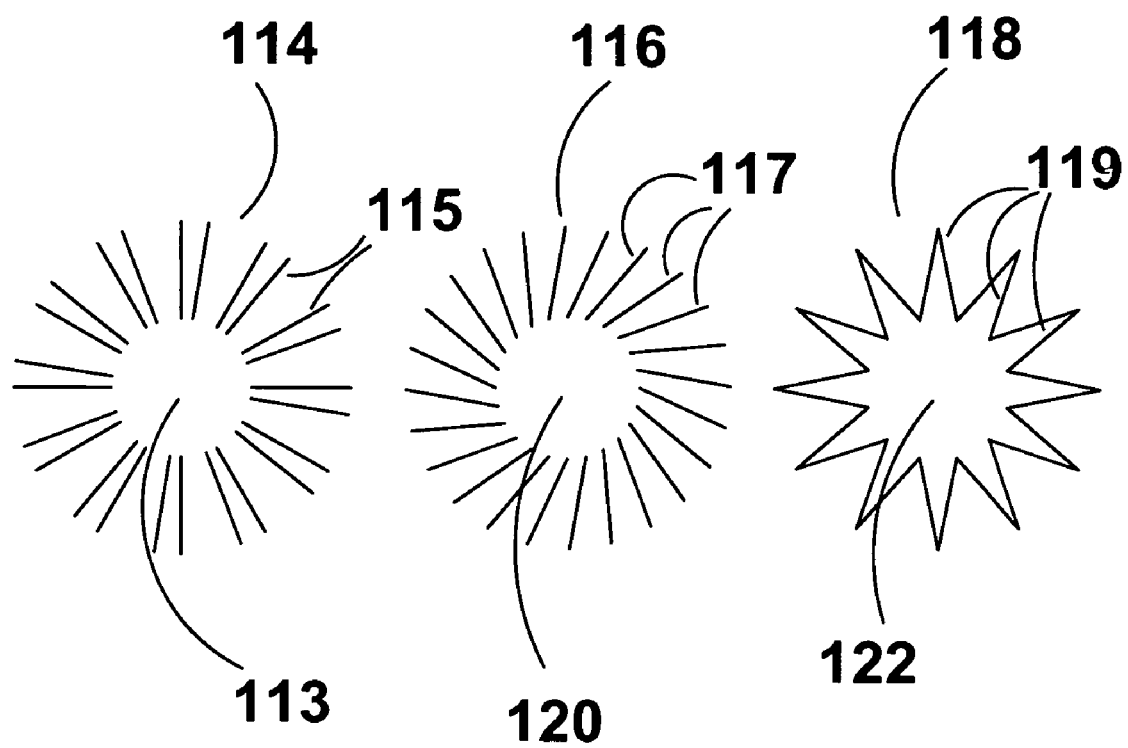
FIG. 18 is a schematic view of showing possible alternative arrangements of the PCB coil component portion of the present invention.

Referring now to FIG. 4, current sensors 22 and 24 each preferably comprises a coreless current sensor made up of a plurality of planar coil printed circuit boards (PCB) 48 which are arranged in a radiating pattern from apertures 42 and 44. The PCB coils are preferably positioned in substantially radial symmetry about the central axis of each aperture. The PCB coils radiate from the apertures such that they are either aligned with angularly spaced planes that are oriented in substantially axial and radial directions relative to the axis of the openings or if they are tilted with respect to these planes, they have the same tilt. FIG. 18 shows three possible orientations of the PCB coils with respect to the central opening. In each example, the PCB coils 115, 117 and 119 are symmetrically arranged around central openings 113, 120 and 122, respectively. Many other orientations are possible provided that the PCB coils are oriented relative to the central aperture to permit the coils to pick up a signal from a cable (not shown) passing through the central aperture and provided that the PCB coils are in substantial radial symmetry. Referring back to FIG. 4, the PCB coils are electrically interconnected in each current sensor such that the output voltages of the PCB coils are combined and applied to output terminals of the sensor (not shown). Current sensor fractions 22B and 22A each have a plurality of PCB coils, as do sensor fractions 24A and 24B. Preferably, sensor fractions 22A, 22B and sensor fractions 24A and 24B each have the same number of PCB coils. As better seen in FIG. 5, sensor fractions 22A, 22B and 24A, 24B are separated from each other when lever portion 40 is pivoted away from body portion 38, thereby permitting apertures 42 and 44 to open up. By opening up as illustrated in FIG. 5, it is simple to mount transformer meter 10 onto the terminals of a distribution transformer by simply positioning the meter such that the terminals of the transformer (not shown) fit through apertures 42 and 44. Latching means 50 is used to keep the two portions of the housing together closed. While any number of latching type devices may be used to keep the two portions of the housing together, the embodiment shown uses permanent magnets 52 and 54 to hold the two portions together.

Figure 6:
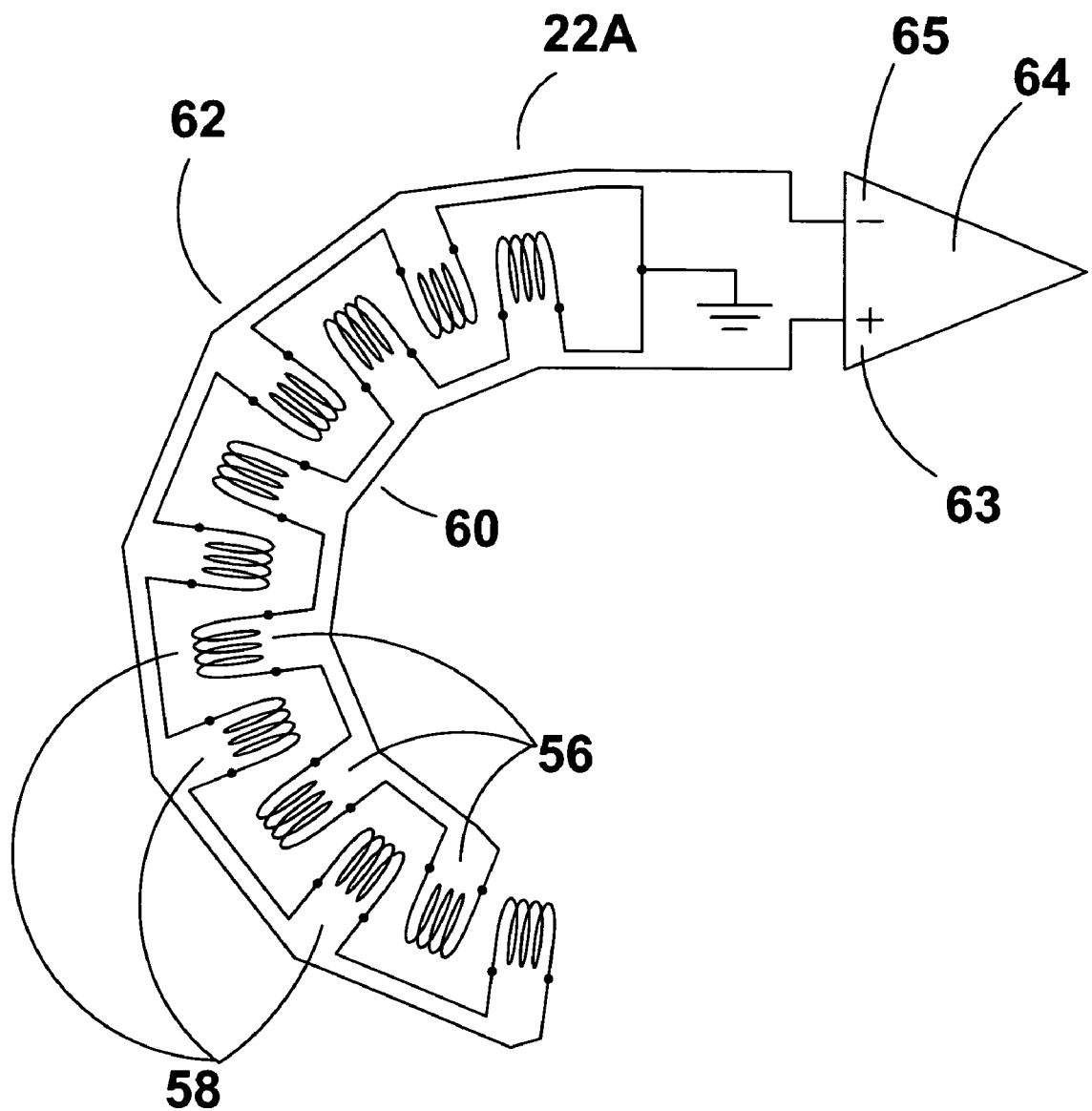
FIG. 6 is a circuit diagram of part of a current sensor portion of the present invention, showing how the PCB coil components are arranged.

Referring back to FIG. 4, each current sensor has two sets of PCB coils, 56 and 58. As illustrated schematically in FIG. 6, PCB coil sets 56 and 58 are electrically interconnected in circuits 60 and 62, respectively. PCB coil sets 56 and 58 are interleaved such that a PCB coil of set 56 is adjacent a PCB coil of set 58. Circuit 60 is coupled to positive input 63 on differential amplifier 64 and circuit 62 is coupled to negative input 65 on the same differential amplifier. This arrangement of PCB coils reduces any errors resulting from electrostatic pick-up.

Figure 7:
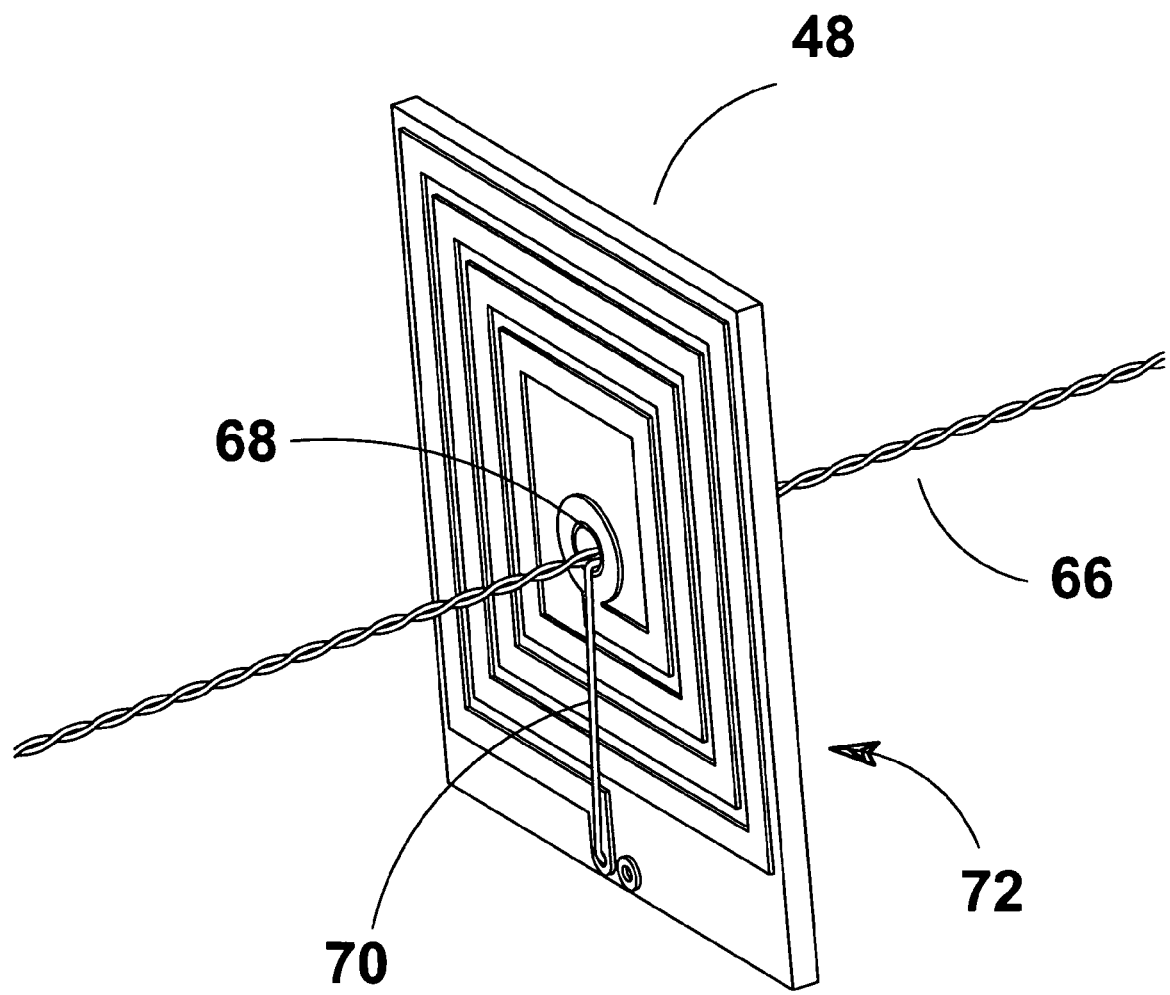
FIG. 7 is a perspective view of a planar coil component of the current sensor shown in FIG. 6 showing how the PCB coil component is coupled to a twisted pair wire.

Referring now to FIGS. 7 and 8, a plurality of PCB coils 48 can be wired using a twisted pair conductor 66. The twisted pair conductor would feed through central aperture 68 in the PCB coil and conductors 70 and 72 are coupled to on the PCB coil to make the circuit. It will be appreciated that when conductors 70 and 72 are coupled to the PCB coil they form an orthogonal loop which could inadvertently pick up stray signals. If the PCB coils are wired improperly, the orthogonal loops would have a width equal to the thickness of the PCB, which would be sufficiently large to pick up stray signals, thereby lowering the accuracy of the current sensor. To minimize the errors which might result from the presence of orthogonal loops, PCB coil 48 should be wired as illustrated in FIG. 8. FIG. 9 illustrates the current passing through the orthogonal loop resulting from an improperly wired PCB coil, while FIG. 10 illustrates the current passing through a properly wired PCB coil. As can be seen, the area of the orthogonal loop is much smaller if the PCB coil is wired correctly.

To reduce the likelihood of signal error induced by orthogonal loops, and to lower the cost of assembling a current sensor, it is possible to build the current sensor using a single elongated flexible printed circuit with a plurality of coils formed thereon rather than a plurality of individual rigid PCB coils. One embodiment of such a current sensor is illustrated schematically in FIG. 17 as item 74. Current sensor 74 consists of an elongated flexible printed circuit 76 having a first set of coils 78 and a second set of coils 80 formed thereon. Coils 78 and 80 are interleaved as in the previous example. Essentially, elongated flexible printed circuit 76 is crimped to form a plurality of panels substantially in a star pattern, where panels containing coils 78 and 80 are separated by blank panels 82 where no coil is formed. Blank panels 82 carry conductors 84 and 86 which are in circuit with coils 80 and 78, respectively. As also illustrated in FIGS. 15 and 16, coils 78 and 80 are on different circuits and are coupled to conductors 86 and 84, respectively. Because the flexible printed circuit is much thinner, the maximum width of the orthogonal loops are necessarily smaller. Furthermore, the tracing pattern used in FIGS. 15 and 16 ensures that the orthogonal loops formed on adjacent coils are approximately 180° to each other; therefore, the voltage errors induced by the presence of the orthogonal loops would tend to cancel out resulting in less overall error.

Figure 17:
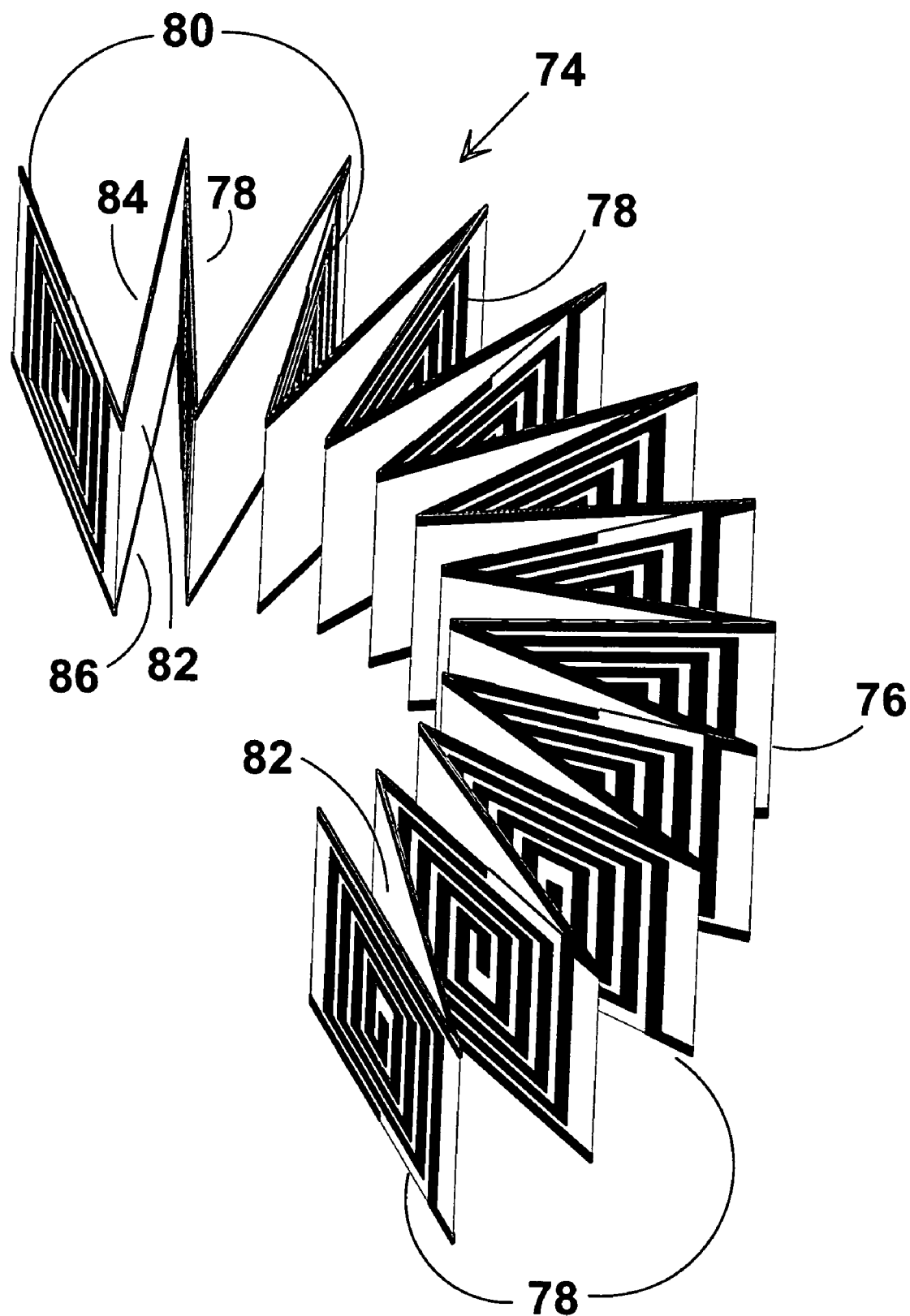
FIG. 17 is a perspective view of a flexible circuit board for use in constructing the current sensor of the present invention.
Figure 26:
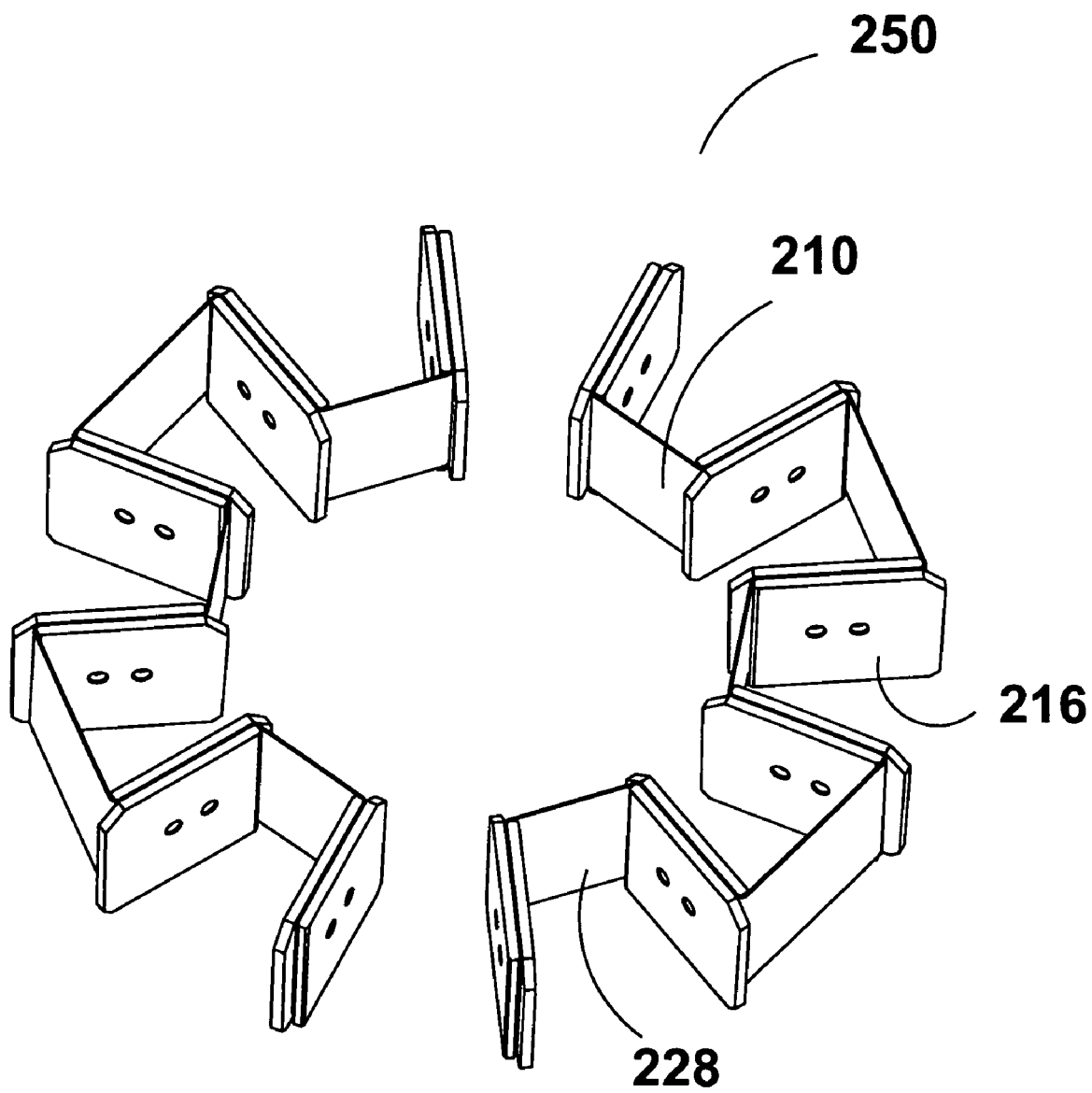
FIG. 26 is a perspective view of an alternate flexible circuit with reinforcing rigid boards for use in constructing the current sensor of the present invention with the coils arranged in the required toroidal manner

The current sensor shown in FIG. 17, while inexpensive, is not ideal because the flexible printed circuit can make it difficult to precisely position the coils and the flexibility of the printed circuit may result in the coils being warped such that the coil is not completely in the same plane. This problem can be corrected by using a plurality of reinforcing rigid boards to keep the coils in the correct orientation. Such a sensor is shown in FIG. 26. This alternate embodiment of the current sensor, shown in FIG. 26 and indicated as item 250, is likewise made from a flexible printed circuit 210 but has a plurality of reinforcing rigid boards 216 to help precisely align the coils into their ideal orientation. As best seen in FIGS. 20 to 22, coils 212, 213, 214 and 215 are formed in printed circuit 210 as in current sensor 74 above (seen in FIG. 17). The coils are separated by gaps 228 in printed circuit 210 which are required to properly space the coils relative to each other in the finished sensor. Printed circuit 210 has an upper "arm" portion 218 and a lower "arm" portion 220 linked together by connecting strip 222. The second layer of printed circuit 210 likewise has coils 224, 225, 226 and 227 formed therein which are likewise separated by gaps 228 in the flexible printed circuit. Apertures 230 are formed in the printed circuit in the approximate center of the coils. Apertures 230 are used to position the coils in the finished sensor.

Figure 23:
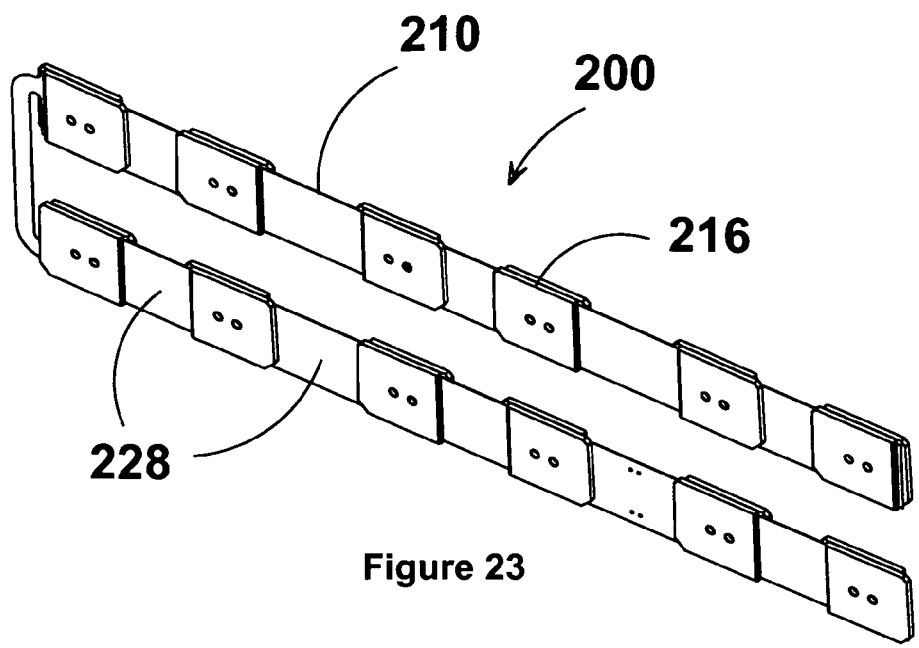
FIG. 23 is a perspective view of an alternate flexible circuit with reinforcing rigid boards for use in constructing the current sensor of the present invention
Figure 24:
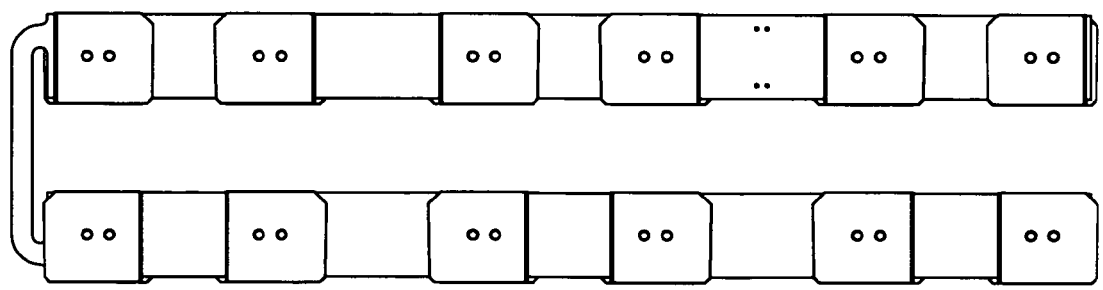
FIG. 24 is a plan view of an alternate flexible circuit with reinforcing rigid boards for use in constructing the current sensor of the present invention
Figure 25:
FIG. 25 is a side view of an alternate flexible circuit with reinforcing rigid boards for use in constructing the current sensor of the present invention

As seen in FIGS. 23, 24 and 25, a plurality of reinforcing rigid boards 216 are mounted to printed circuit 210 with gaps 228 separating the reinforcing boards. Reinforcing boards 216 ensure that the coils remain rigid and in plane. Preferably, the coils are sandwiched between boards 216 to ensure that they remain in the correct orientation. As can be seen in FIG. 26, the sensor is simply assembled by placing the boards 216 in the correct orientation as illustrated. Gaps 228 ensure that the coils sandwiched between boards 216 can be oriented correctly.

Figure 12:
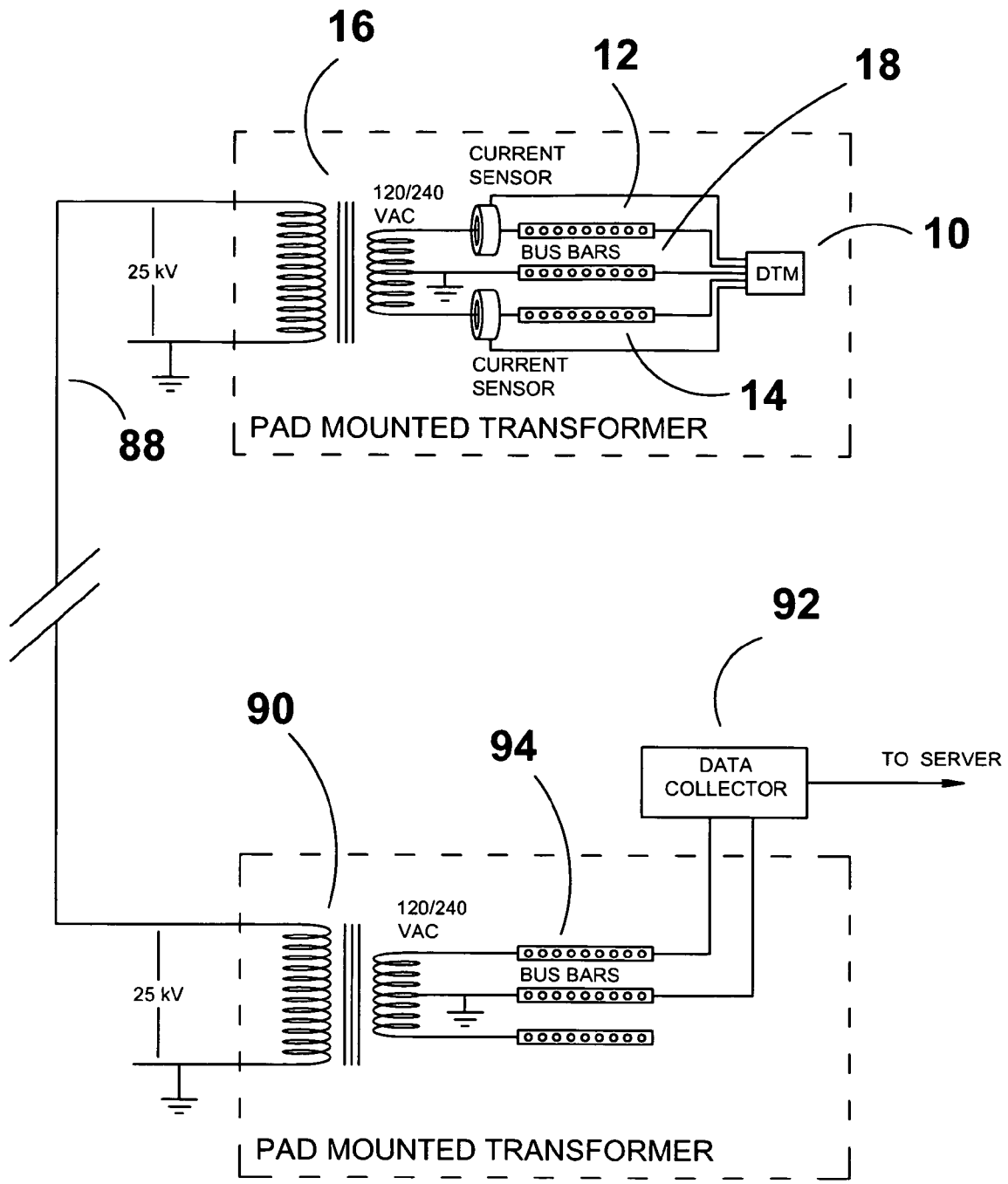
FIG. 12 is a schematic diagram showing the transformer meter made in accordance with the present invention coupled to a distribution transformer in communication with a remote data collector.

Referring now to FIG. 12, the distribution transformer meter 10 is coupled to terminals 12, 14 and 18 of the distribution transformer 16 which is in turn coupled to high voltage feeder line 88. Feeder line 88 is in turn coupled to distribution transformer 90 which may be several kilometers away. Coupled to terminals 94 of distribution transformer 90 is power-line communications module 92 which is adapted and configured to receive communications signals from DTM 10, provided of course that DTM 10 is provided with a power-line communications module. Module 92 is configured to not only receive data packages from DTM 10 but also to transmit time synchronization signals which can be received by DTM 10. After DTM 10 receives the time synchronization signals from module 92, it begins to measure and record current and voltage information from distribution transformer 16 and sends data packages to module 92 after each timing period. A suitable power-line communications module suitable for use as module 92 is disclosed in U.S. Pat. No. 6,549,120 to de Buda referred to earlier on.

Figure 27:
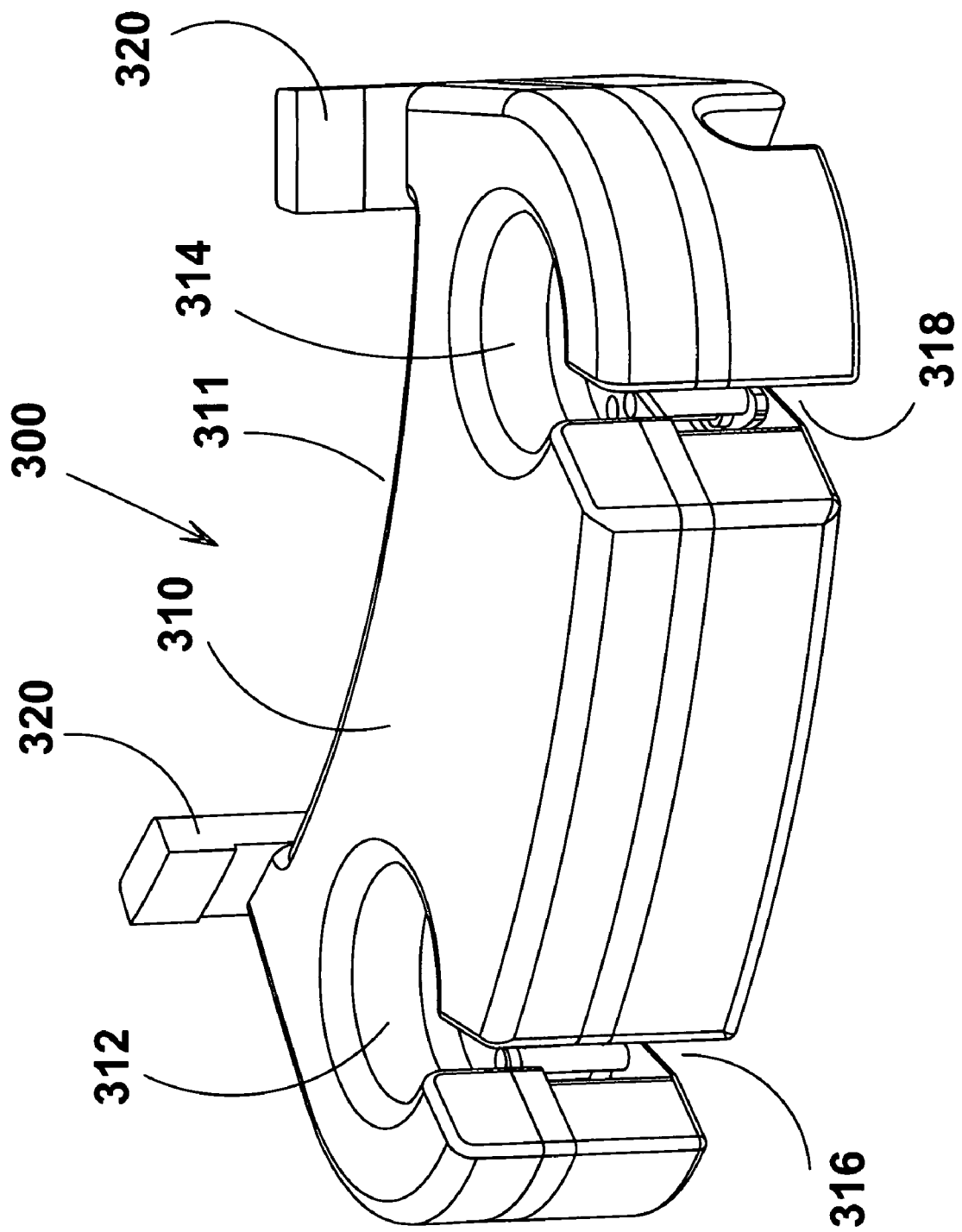
FIG. 27 is a perspective view of an alternate embodiment of the present invention wherein the housing has been design for pole mounted transformers
Figure 28:
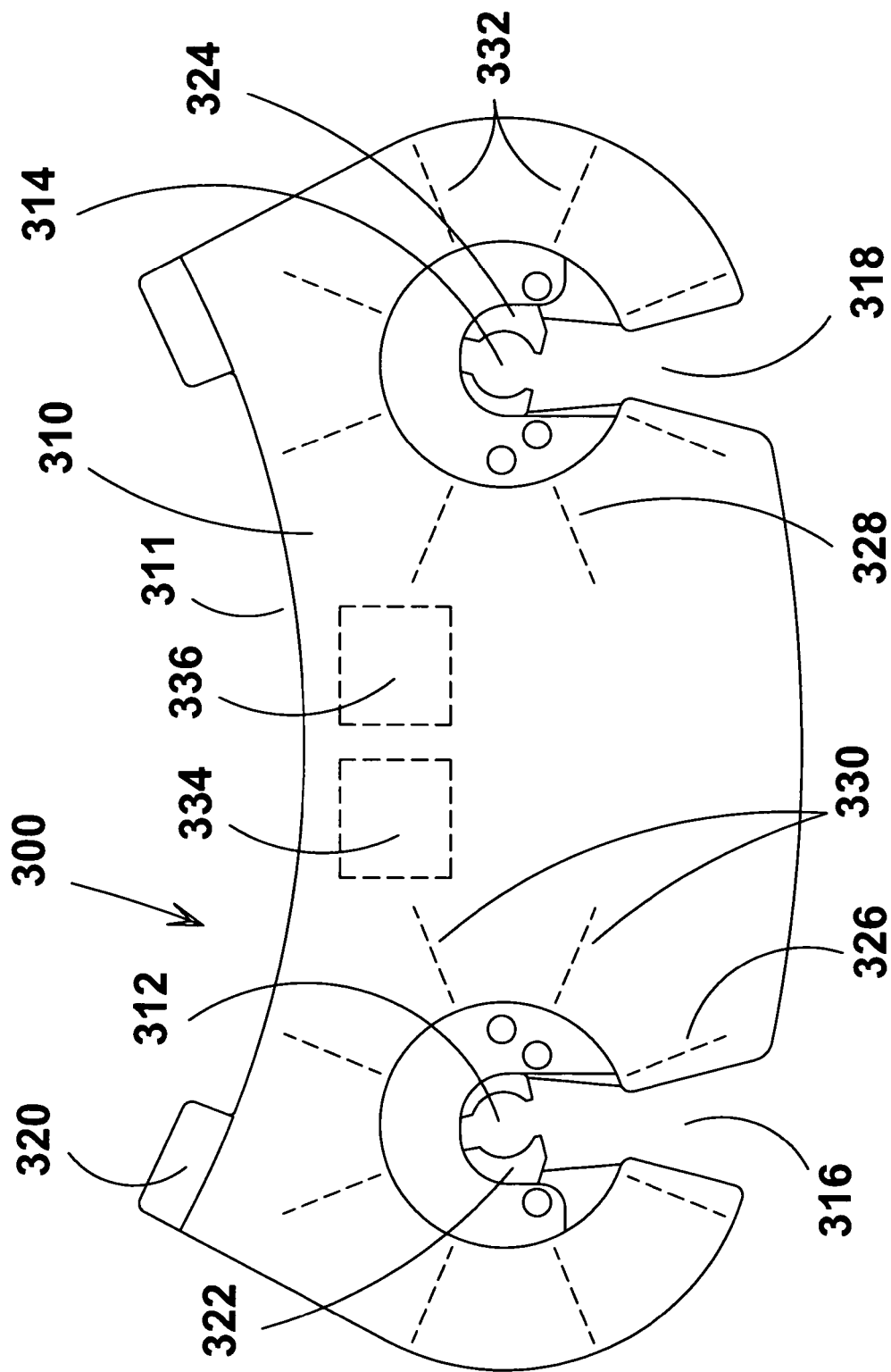
FIG. 28 is a plan view of an alternate embodiment of the present invention wherein the housing has been design for pole mounted transformers

To facilitate the use of the present invention with pole-mounted transformers, it is possible to modify the DTM housing such that the DTM can be mounted directly on a pole-mounted transformer. A DTM made in accordance with the present invention which has been configured for use with a pole-mounted transformer is shown in FIGS. 27, 28 and 29 as item 300. As seen in FIG. 27, DTM 300 has an arch shaped housing 310 having concave side 311 and apertures 312 and 314 having passages 316 and 318, respectively. Housing 310 also has mounting members 320 adjacent concave side 311. Referring now to FIG. 28, DTM 300 has insulation piercing connectors 322 and 324 positioned in apertures 312 and 314, respectively. As in the previous embodiment of the DTM, DTM 300 has current sensors 326 and 328 made up of a plurality of coils 330 and 332. Also as in the previous embodiments, DTM 300 has an instrumentation module 334 coupled to current sensors 326 and 328 and to insulation piercing connectors 322 and 324, and a communications module 336 coupled to the instrumentation module. The current sensors, instrumentation module and the communications module may be identical to those in the previous embodiment of the DTM. As best seen in FIG. 29, apertures 312 and 314 of DTM 300 are configured to receive conductors 338 and 340 of pole-mounted mounted transformer 342. DTM 300 can be secured to transformer 342 by means of band 344 wrapped around mounting members 320.

The DTM of the present invention is particularly useful as a component in an improved system of detecting power theft using accumulated in-phase current (AIPC) accounting. Energy accounting as a method of detecting electricity theft can be very effective at the distribution transformer level because of the small number of customers involved. Errors due to line losses may be 0.5% to 3% and the number of customers may be no more than ten. In this case the total amount of energy lost to the lines would amount to no more than a fraction of the amount used by a single customer, and an even smaller fraction of the amount likely to be involved in any theft.

At the feeder level, the situation is different because many more customers are involved. Here the energy lost in the lines is likely to be many times greater than the amount used by a single customer. Thus, the detection of theft is more difficult, and the sensitivity and reliability of the method is heavily dependent on the accuracy of the energy accounting process.

An improvement in the accuracy of the energy accounting process can be achieved by estimating the line losses and compensating for them, but there is a serious conceptual problem which limits the benefit that this can afford. The problem is that line losses are proportional to the square of the current level and therefore vary with load, and that's without even taking into account variable losses due to line resistance changing with temperature. This makes it very difficult to know what these losses are with sufficient accuracy.

For example, if we have a feeder which is supplying 100 Amps to a steady unchanging load consisting of residential customers, the line losses might amount to 1%. If, however, during one measurement interval, the load changes such that half the time the load is 200 Amps and the rest of the time the load is zero, the result will be that line losses during the measurement period are doubled. Instead of 1%, the line losses would be 2% Since this change occurs within a measurement interval, it cannot be detected from the meter data.

For a feeder with 1000 customers, a change in line losses from 1% to 2% represents a reduction of energy flow to customers, equivalent to ten times the load of an average customer.

There are a number of ways to cope with this. One can reduce the error by reducing the measurement interval, but this increases the amount of data that must be transmitted and processed and doesn't totally solve the problem. One can attempt to depend on statistical averaging, but this only works most of the time. Thus one is left with a trade-off between sensitivity and the prevention of false alarms. If the threshold is set too low, there will be too many false alarms. If the threshold is set too high, actual theft will not be detected. In between these two levels will be a range of threshold values which cause too many false alarms and fail to detect real theft.

Thus, energy accounting as a method of theft detection has an inherent source of error which is independent of accuracy of the instrumentation used. Even if the feeder meter(s), the distribution transformer meters, and the customer meters were totally error free, this method would still have a major source of error which would limit its sensitivity, and therefore its ability to detect electricity theft.

An alternative method which does not possess this source of error is to use Accumulated In-Phase Current (AIPC). AIPC is simply the non-voltage component of energy, thus removing the voltage term from the equation. Since line losses are characterized by voltage losses rather than current losses, this method is virtually immune to the effect of line losses. This means that higher levels of overall accuracy can be achieved, which translates into greater sensitivity, and therefore a greater ability to detect theft, limited primarily by the metering accuracy. Thus, AIPC provides a measure for theft detection that is superior to the use of energy consumption (kWh).

In a system of feeder meters (FMs), distribution transformer meters (DTMs) and customer meters (CMs), AIPC provides the best means for detecting theft as it is independent of varying line losses. One difficulty with this concept is that CMs generally do not provide AIPC data, and of course, AIPC cannot be compared with kWh. However, if DTMs are used, they can be programmed to provide both AIPC and kWh. Then kWh can be used to reconcile between the DTMs and the CMs (where small numbers of customers are involved) while AIPC is used to reconcile between the FMs and the DTMs (where larger numbers of customers are involved).

In certain situations, such as rural areas where there is only one customer per transformer, it may be considered to be undesirable to deploy DTMs. In such a case, the customer meters could be supplied with the ability to transmit both the energy consumption reading, and the Accumulated In-Phase Current reading. The energy consumption reading would be used for billing, while the AIPC reading would be used together with the feeder current meter reading to detect theft with greater sensitivity and reliability than would be possible using energy consumption data.

The most accurate approach, and the one which would be the most sensitive to theft and least likely to generate false alarms, would be to add a true AIPC capability to the CMs. The problem with this is the amount of development required by the meter manufacturers to implement this capability. Nevertheless, by using the existing capability in the meter one could achieve a close approximation. The CMs in addition to transmitting the accumulated kWh for each one hour period would also transmit the maximum voltage and the minimum voltage. From this data one could determine the maximum possible AIPC and the minimum possible AIPC as follows:

$$\text{Maximum AIPC} = \text{kWh}/\text{Minimum Voltage}$$

$$\text{Minimum AIPC} = \text{kWh}/\text{Maximum Voltage}$$

To compare the AIPC at the feeder level with the AIPC at the transformer secondary level, it is necessary to account for the transformer transformation ratio which is the primary side voltage divided by the secondary side voltage. A simply way to do this is to convert AIPC to normalized active energy or NAE by multiplying AIPC by the nominal voltage. This is done as follows:

NAE=normalized active energy=AIPC×nominal voltage

The theft alarm is triggered if the feeder current meter NAE minus the error margin is greater than the sum of the NAE readings at the CMs. The sensitivity of this technique, in terms of the minimum theft load needed for detection, for each one hour period can be evaluated as follows:

Min Detectable Theft Load=Voltage×(Max AIPC−Min AIPC)+error margin

This technique will have the highest sensitivity during periods of constant voltage, and yet during periods of changing voltage, false alarms will still be minimized. Since the targeted theft loads are base-load in nature, they should be readily detectable during periods of high sensitivity. Furthermore, sensitivity can be substantially enhanced during any one hour measurement period simply by subdividing the hour into five-minute measurement intervals. The sensitivity would then be limited by the amount of voltage change occurring during the five minutes. This is likely to be small in any normal situation, so that it should generally be possible to maintain high sensitivity at all times with this technique.

Feeder Current Meter Theft Detection Based on RMS Current

Since the sensitivity of any theft detection system varies inversely with the number of customers, it is beneficial to use multiple FCMs on a feeder such that each FCM (feeder current meter) covers a different subset of the customers on that feeder. This will only work where the feeder branches into different sections. In this case, different feeder meters can be installed on each branch. In cases where this can be done, there is still the problem that the line from the substation to the first branch (or customer) would need to be protected, and yet on this line the number of customers cannot be subdivided. This section of line can be protected by two FCMs, one at the substation, and one just before the first customer, both of them measuring RMS (root-mean-squared) current. RMS current can be measured more accurately than kWh or even AIPC because there is only one input into the measurement process. Accuracy can be further enhanced by calibrating two identical FCMs together, thus giving this section of line the best possible protection against theft.

Feeder Current Meter with kWh Capability

The standard feeder current meter does not have a connection across high voltage, but voltage information is needed to calculate kWh. A standard method would be to use a shielded resistive voltage divider or a potential transformer, each method having its own unique advantages and disadvantages. Both methods can provide superior accuracy, but are expensive and inconvenient when accuracy is required. An alternative method is to measure the voltage on the secondary side of an existing distribution transformer and multiplying by the turns ratio.

This method could be implemented by a device which clamps onto the distribution transformer near the location of the feeder current meter (FCM). This device would measure voltage and current and combine them to produce voltage data for the primary side. This data would be continuously transmitted in real time, via short range radio, to the FCM which would use it to provide kWh data.

There are two main sources of error with this approach. The first is the accuracy of the turns ratio, and the second is the drop in voltage output as the transformer is loaded.

If the transformer meets the CSA specification, the turns ratio (rated high voltage/rated low voltage on nameplate) will be within +/−0.5%. Also the transformer impedance (typically 1% to 3%) shown on the nameplate will be accurate to within +/−5%. Thus one could measure the load current and use this data to compensate for the voltage drop in the transformer. If one assumes an instrumentation error of 0.15% for both the voltage and current measurements, then the overall worst case high voltage measurement error for a transformer with 3% impedance would be:

3%×5%+0.15%+0.5%+0.15%≈1%.

This level of accuracy would only be suitable in situations where small numbers of customers are involved as would be true of any theft detection system which is based on kWh. The irony of this is that the extra expense and other drawbacks of providing a feeder current meter with a kWh capability, only results in enabling a system of theft detection which is mathematically inferior to one based on AIPC (Accumulated In-Phase Current). If AIPC is used instead, there will be a greater ability to detect theft and a greater ability to reduce false alarms, and the feeder current meter will not need any expensive voltage measurement instrumentation.

There are other advantages as well. Since there is no requirement for the feeder current meter to measure voltage, it can be a much smaller, lighter, and safer device. Since it does not need to be connected across any high voltage, no high voltage fuses are required. This reduces the size and weight of the device. Being lightweight means that it can clamp directly onto a feeder with no other means required to support its weight. Thus deployment can be achieved much more quickly, and there is more flexibility with regards to where the device can be installed. Finally, the device is inherently safe. Unlike devices which connect across the high voltage, this device completely eliminates the risk of internal arcing around a fuse enclosure and thus eliminates the danger of explosion during installation.

What is AIPC (Accumulated In-Phase Current)

AIPC is simply the non-voltage component of energy.

Energy=∫Pdt=∫V*I dt=Accumulation of voltage times real (non-reactive) current

AIPC=∫Idt where I=real current=Accumulation of non-reactive current

Energy is measured in kWh while AIPC is measured in Ah

If we have a 7.2 kV feeder (phase-to-ground) which is supplying 100 Amps to a steady unchanging load, where the feeder line from the substation to the customer has 0.72 Ohms, the voltage drop over this length of line would be 72 Volts. If the voltage at the substation is 7200 Volts then the voltage at the customer would be 7200−72=7128 Volts. The energy registered at the substation for a one hour period would be 7.2×100=720 kWh. A the load, the metered energy would be 7.128×100=712.8 kWh. In this case ((720−712.8)/720)×100%=1% of the energy is lost due to line losses.

In the next one hour interval the substation supplies 200 Amps during the first 30 minutes and no current for the rest of the interval. During the first 30 minutes 200×7.2×30/60=720 kWh are registered at the substation and therefore also for the entire one hour period as well. At the load, however, the voltage drop is doubled as it is proportional to current and the customer voltage is 7200−(200×0.72)=7056 Volts for the first 30 minutes and 7200 Volts for the following 30 minutes. The energy metered at the customer(s) is then 7056×200×30/60=705.6 kWh for the first 30 minutes and therefore for the entire one hour interval as well. In this case, ((720−705.6)/720)×100%=2% of the energy is lost due to line losses.

Since the same amount of energy (720 kWh) is registered at the substation in both cases, this measurement cannot be used to predict the amount of energy lost to the line. Volt-hours at the customer is also not useful for similar reasons. In both of these cases, there would be 7128 Volt-hours at the customer(s), and yet in the second case there are 7.2 fewer kWh. Thus an attempt to estimate AIPC by dividing Watt-hours by Volt-hours will suffer from the same mathematical error caused by load induced line loss variations.

If true AIPC is used, then in both cases, 100 Ah would be registered at both the substation and at the customer(s) (unless there is theft). If AIPC is not available, then using maximum voltage and minimum voltage to calculate minimum AIPC and maximum AIPC is the next best thing.

It will be appreciated that the transformer meter made in accordance with the present invention can be used in an AIPC based system of monitoring and accounting for electricity consumption as described above. The system of the present invention is illustrated schematically in FIG. 13 as item 110 and consists of a plurality of distribution transformers 16 each coupled to a distribution transformer meter 10 made in accordance with the present invention. Distribution transformers 16 are each coupled to a load 96 (for example several residential power consumers) and to a high voltage feeder line 88. High voltage feeder line 88 is in turn coupled to a substation transformer 100. Distribution transformer 90 is also coupled to feeder line 88 and data collector 92 is in turn coupled to distribution transformer 90. Each of the distribution transformer meters 10 records the AIPC used by its corresponding load 96 during a given time period and sends this information to data collector 92. Substation transformer 98 is coupled to feeder current meter 101a, which, like transformer meters 10, is configured to calculate and record the AIPC for a given time period. Feeder current meter 101a is further configured to send the AIPC measurements to data collector 92, preferably via power-line communications signals. Transformer meters 10 are configured to transmit their AIPC measurements to data collector 92, preferably via power-line communications. Data collector 92 then sends these AIPC measurements to central computer 112 which does not need to be near data collector 92 and which can be connected to other data collectors as well. Each meter 10 sends a unique identifier code along with its AIPC measurement; hence, server 112 can compare the AIPC measurements received by each meter 10 and compare them to the AIPC measurement for the same time period from feeder current meter 101a. This comparison is done by first converting AIPC to normalized active energy or NAE. NAE is simply AIPC multiplied by the nominal voltage. In the case of the transformer meters 10 the nominal voltage would typically be 240 V. For the feeder current meter, the nominal voltage could for example be 7200 V if the transformer transformation ratio is 30. The total NAE derived from meters 10 should be equal to the NAE derived from the measurement recorded by feeder current meter 101a for the same time period within a reasonable margin of measurement error. If there is a significant difference between the totals of the NAE, then this must mean that there is an unknown load attached to the feeder. The utility, which operates server 112 can then investigate the extra load.

This system of current accounting has several advantages. Firstly, a device which measures only AIPC at feeder current meter 101a does not require high voltage operation. For this reason, AIPC metering of feeder 88 is much safer and much less expensive than energy metering. In addition, as will be discussed below, the present system of monitoring a network via current accounting makes it possible to detect the theft of electricity directly from the feeder which can occur with the unauthorized coupling of a distribution transformer directly to the high voltage feeder.

The DTM is configured to detect two different kinds of electricity theft. The first kind is theft of electricity from a utility owned distribution transformer. The DTM does this in conjunction with electricity meters installed at the end users. The electricity consumption at the transformer must substantially equal the sum of the electricity consumptions at the end users. To do this comparison, however, the utility must know which end users are connected to which distribution transformers. This information can be collected using mapping. This involves the generation of two dimensional images or diagrams (which can be on paper or in electronic form for display on computer monitor) which show, in representative form, the distribution transformers, the end-users and the interconnections between them. Generating these maps involves a fair amount of work, not only to produce them initially, but also to keep them up to date as changes are made to the power system. Even once these maps have been produced and are up to date, there is still some work required to interpret the maps in order to generate the equations which are used to check for the unauthorized use of electricity.

Figure 13:
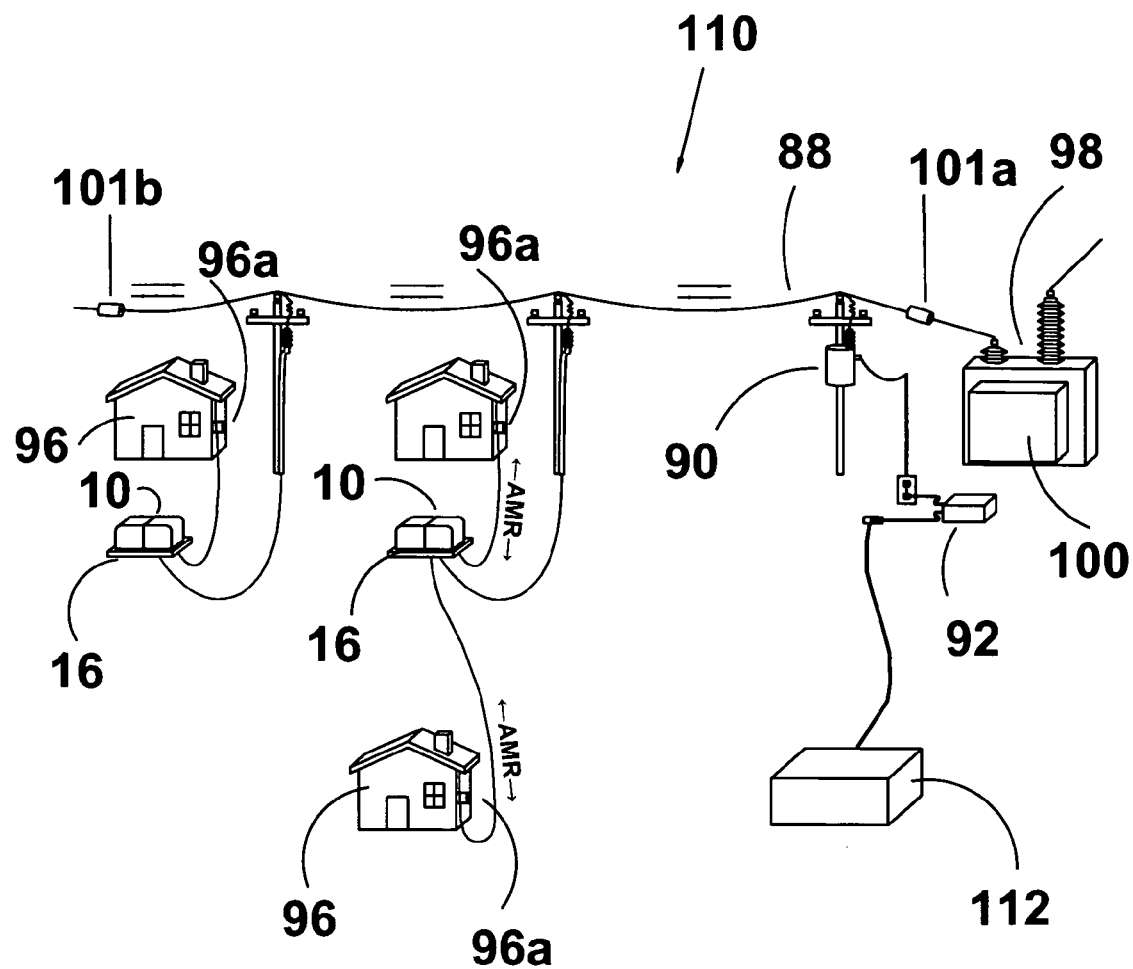
FIG. 13 is a schematic diagram showing the system of the present invention.

Referring now to FIG. 13, the DTM (item 10) made in accordance with the present invention eliminates the need to produce these maps. By measuring the signal strength of the AMR signals from meters 96a at the end-users 96 and comparing these to a threshold value, the DTM can determine which of the AMR signals originate on the secondary circuit of the transformer on which it is installed. This information can be stored in electronic memory in the DTM and relayed to the data collector 92 on request. Thus the data collector is provided with not only the energy supplied by the distribution transformers and the energy consumed by the end-users 96, but also the information of which end-users are connected to which distribution transformers.

Figure 19:
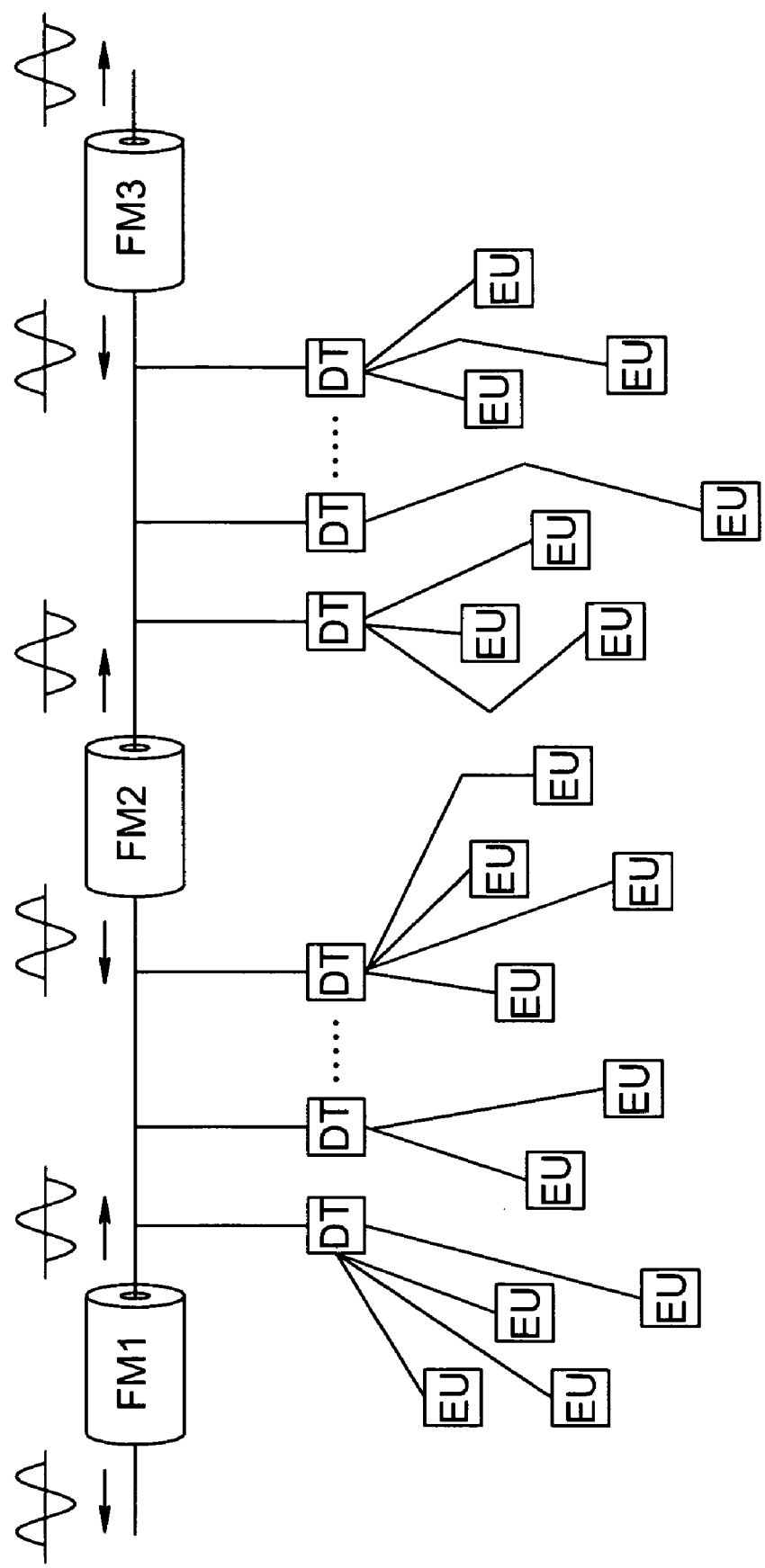
FIG. 19 is a schematic view showing an alternate embodiment of the system of the present invention.

Referring now to FIG. 19, theft directly from the feeder can be done by the unauthorized installation of a non-utility owned distribution transformer on the high voltage feeder. The utility would not necessarily know about the existence of such a transformer and would, of course, not have one of its DTMs installed therein. Thus a comparison between energy supplied by the utility owned distribution transformers and the energy consumed by the end-users would not detect this kind of electricity theft. To detect this kind of theft, the DTM can be used in conjunction with a series of feeder meters (FM1, FM2, FM3 etc). A feeder meter, according to the state of the art, measures energy supplied by the feeder. This requires multiplying voltage and current to determine power and integrating the power over a period of time to determine energy. Theft could be detected by comparing the energy supplied by the feeder with the energy supplied by the distribution transformers on that feeder. A major disadvantage of this approach is that the feeder meter must be designed and built for high voltage operation. High voltage devices are expensive and depending on the design, can be hazardous to install. Furthermore, voltage drops occur in every feeder due to current flow and line resistance, and these voltage drops are a source of measurement error in the comparison. Increased measurement error means that more feeder meters are needed for a given number of distribution transformers in order to be able to distinguish between measurement error and theft.

An alternative feeder meter, the feeder current meter that could be used in conjunction with DTM is one that only measures in-phase current and integrates this current over a period of time (such as one hour) to determine AIPC. If both the DTM and the feeder current meter provide AIPC measurements, these can be converted to NAE and compared (energy and AIPC cannot be compared) to detect theft from the feeder. To provide this capability while maintaining the ability to detect theft from a utility owned distribution transformer, the DTM according to the present invention can be programmed to provide both measurements, that is energy supplied by the distribution transformer and AIPC supplied by the same transformer.

FIG. 19 shows a number of feeder current meters (FM1, FM2 and FM3), distribution transformers (DT), and end-users (EU). Just as it is necessary to know which end-users are connected to which distribution transformers, it is also necessary to know which distribution transformers are associated with which feeder current meter and how. From FIG. 19 one can see that here the situation is more complicated at the feeder level. The simplest feeder current meter topology would be one where a single feeder current meter monitors the entire feeder and its NAE values are compared to the NAE values for all of the distribution transformers, however, the accuracy limitations could result in total measurement error being greater than the amount of theft in which case the theft would not be detected. Thus it may be necessary to have more than one feeder current meter along the feeder and its branches. The distribution transformers are then not associated with any one feeder meter. Instead they are associated with the feeder segment between two feeder meters. The difference between the NAE measurements of two feeder meters should be substantially equal to the sum of the DTM NAE measurements of all of the utility owned distribution transformers on the feeder segment between the two feeder meters.

To do comparisons between the feeder current meter measurements and the DTM measurements, it is necessary to know where on the feeder the feeder meters are and where on the feeder the connections to the distribution transformers are. The information could be gathered through mapping. This involves the generation of two dimensional images or diagrams which show, in representative form, the distribution transformers, the feeder meters and the interconnections. As described earlier, generating such maps involves a fair amount of work, not only to produce them initially, but also to keep them up to date as changes are made to the power system. Even once these maps have been produced and are up to date, there is still some work required to interpret these map in order to generate the equations which are used to detect the unauthorized use of electricity.

The DTM according to the present invention eliminates the need to produce such maps, but the process for acquiring the necessary information is different where feeder meters are involved. The process begins with the data collector sending, via power line carrier communications, a carrier duplicate instruction to all of the feeder meters on the feeder. This instruction is followed by a pure carrier sent for a fixed length of time. Then the feeder meters transmit in succession a duplicate carrier which is substantially identical in frequency and phase using inductive coupling to the feeder. The inductive coupling, used by the feeder meter power line carrier transmitter, results in the signal going in one direction from the feeder meter being 180 degrees out of phase with the signal going in the other direction. Thus these signals can be classified as positive signals or negative signals. All of the DTMs on the feeder record, for each feeder meter, whether they have received a positive or negative signal. This information is relayed to the data collector on request and thus the data collector is not only provided with the AIPC (or energy or both) measurements from all of the feeder meters and DTMs, but is also provided with all the information required to do the comparisons for theft detection, thus eliminating the need to do any mapping.

From FIG. 19 we see how this works. All of the DTMs connected to the feeder segment between feeder current meter FM2 and feeder current meter FM3 will receive a positive signal from feeder current meter FM2 and a negative signal from feeder current meter FM3. All of the DTMs on the other side of the feeder meter FM3 will receive a positive signal from both feeder meters, and all of the DTMs on the other side of feeder current meter FM2 with receive negative signals from both feeder current meters. Thus the sum of the NAE measurements of all the DTMs which receive a positive signal from feeder meter FM2 and a negative signal from feeder meter FM3 should substantially equal the NAE measurement of feeder meter FM2 minus the NAE measurement of feeder meter FM3.

The distribution transformer meter of the present invention also has several advantages over the prior art. Firstly, having a unitary construction, it is safer and easier to install. Furthermore, the improved current sensors are much more accurate than previous current sensors, thereby permitting the accurate measurement and recording of integrated current.

A specific embodiment of the present invention has been disclosed; however, several variations of the disclosed embodiment could be envisioned as within the scope of this invention. It is to be understood that the present invention is not limited to the embodiments described above, but encompasses any and all embodiments within the scope of the following claims.

Therefore, what is claimed is:

1. A meter for measuring voltage and current on a distribution transformer, the meter comprising:

a housing having a body portion and a lever portion, the lever portion being movably mounted to the body portion and movable between a closed position wherein the lever portion abuts the body portion and an open position wherein the lever portion is positioned away from the body portion;

first and second current sensors each divided into two corresponding sensor fractions with one fraction of each sensor formed on the body portion of the housing and the other corresponding fraction of each sensor formed on the lever portion of the housing, the fractions of the first and second current sensors configured such that each of the first and second current sensors have a central opening dimensioned to receive a terminal of the transformer when the lever portion of the housing is in its first position;

the first and second current sensors being further positioned on the housing such that the meter can be mounted to the terminals of the transformer with the first current sensor receiving one terminal of the transformer and the second current sensor receiving another terminal of the transformer;

first and second voltage leads, mountable to said of the transformer;

an instrumentation module coupled to the current sensors and the voltage leads, said instrumentation module adapted and configured to record voltage and current measurements from the current sensors and voltage leads, a communications module coupled to the instrumentation module for communicating the voltage and current measurements to a remote user.

2. The meter of claim 1 wherein the first and second current sensors each comprise a plurality of planar coils radiating from the central opening, the planar coils being positioned in substantial radial symmetry about a central axis of the central opening, some of the planar coils of each sensor being contained in the body portion of the housing and some of the planar coils of each sensor being contained in the lever portion of the housing, said coils being electrically interconnected in each sensor such that output voltages of said coils are combined and applied to output terminals of said sensor.

3. The meter of claim 2 wherein there are a first and second sets of planar coils electrically interconnected in a first and second circuit, respectively, the first and second planar coils being interleaved, the first circuit being coupled to a positive input on a differential amplifier and the second circuit being coupled to a negative input on the differential amplifier.

4. The meter of claim 3 wherein the lever portion of the housing is pivotally connected to the body portion of the housing, and further comprising a latch for latching and unlatching the lever member in its first position.

5. The meter of claim 1 wherein the instrumentation module is configured to periodically measure the voltage and current measurements over a time interval and store said measurements in a memory, and wherein the communications module is configured to transmit the stored measurements to the remote user.

6. A meter for measuring voltage and current on a transformer of the type having at least two terminals, the meter comprising:
a housing,
first and second clamp-on current sensors mountable to the terminals wherein the first and second current sensors each comprise a first and second set of planar coils radiating from a central opening, the planar coils being positioned in substantial radial symmetry about a central axis, said coils being electrically interconnected in each sensor such that output voltages of said coils are combined and applied to output terminals of said sensor, and wherein the first and second sets of planar coils are electrically interconnected in a first and second circuit, respectively, the first and second circuits being interleaved, the first circuit being coupled to a positive input on a differential amplifier and the second circuit being coupled to a negative input on the differential amplifier;
first, and second voltage leads, mountable to the terminals;
an instrumentation module contained in the housing and coupled to the current sensors and the voltage leads, said instrumentation module adapted and configured to record voltage and current measurements from the current sensors and voltage leads, and
a communications module coupled to the instrumentation module for communicating the voltage and current measurements to a remote user.

7. The meter of claim 6 wherein the communications module comprises a power line communications module for communicating the voltage and current measurements to a remote user through power lines coupled to the transformer.

8. The meter of claim 7 wherein the instrumentation module is configured to periodically measure the voltage and current measurements over a time period and store said measurements in a memory, and wherein the communications module is configured to transmit the stored measurements to the remote user.

9. The meter of claim 8 wherein the a housing has a body portion and a lever portion, the lever portion being movably mounted to the body portion and movable between a closed position wherein the lever portion abuts the body portion and an open position wherein the lever portion is positioned away from the body portion, and wherein the first and second current sensors are each divided into two corresponding sensor fractions with one fraction of each sensor formed on the body portion of the housing and the other corresponding fraction of each sensor formed on the lever portion of the housing, the fractions of the first and second current sensors configured such that each of the first and second current sensors have a central opening dimensioned to receive a terminal of the transformer when the lever portion of the housing is in its first position, and wherein the first and second current sensors are further positioned on the housing such that the meter can be mounted to the terminals of the transformer with the first current sensor receiving one terminal of the transformer and the second current sensor receiving another terminal of the transformer.

10. The meter of claim 9 wherein the first and second voltage leads each comprise a conductive clip mounted on the housing adjacent the first and second current sensors, respectively, the clips each being dimensioned and configured such that each clip electrically contacts the terminal received in the corresponding current sensor opening.

11. The meter of claim 10 wherein the lever portion of the housing is pivotally connected to the body portion of the housing, and further comprising a latch for latching and unlatching the lever member in its first position.

12. The meter of claim 11 wherein the communications module comprises a power line communications module for communicating the voltage and current measurements to a remote user through power lines coupled to the transformer.

13. A meter for measuring voltage and current on a transformer of the type having at least two terminals, the meter comprising:
a housing,
first and second current sensors mountable to the terminals;
first, and second voltage leads, mountable to the terminals;
an instrumentation module contained in the housing and coupled to the current sensors and the voltage leads, said instrumentation module adapted and configured to record voltage, current and average current measurements from the current sensors and voltage leads over a period of time, the instrumentation module being further configured to record an accumulated in-phase current measurement over the period of time the accumulated in-phase current measurement being equal to the average in-phase current multiplied by the length of time the time period, and
a communications module coupled to the instrumentation module for communicating the voltage measurements, the current measurements and the accumulated in-phase current measurement to a remote user.

14. The meter of claim 13 wherein the communications module comprises a power line communications module for communicating the voltage and current measurements to a remote user through power lines coupled to the transformer.

15. The meter of claim 14 wherein the first and second current sensors each comprise a plurality of planar coils radiating from the central opening, the planar coils being spaced with substantial radial symmetry, the planar coils being either aligned with angularly spaced planes that are oriented in substantially axial and radial directions relative to the axis of said opening, or tilted with the same tilt with respect to said planes, some of the planar coils of each sensor being contained in the body portion of the housing and some of the planar coils of each sensor being contained in the lever portion of the housing, said coils being electrically interconnected in each sensor such that output voltages of said coils are combined and applied to output terminals of said sensor.

16. The meter of claim 15 wherein there are a first and second sets of planar coils electrically interconnected in a first and second circuit, respectively, the first and second planar coils being interleaved, the first circuit being coupled to a positive input on a differential amplifier and the second circuit being coupled to a negative input on the differential amplifier.

17. The meter of claim 16 wherein the a housing has a body portion and a lever portion, the lever portion being detachably mounted to the body portion and movable between a closed position wherein the lever portion abuts the body portion and an open position wherein the lever portion is positioned away from the body portion, and wherein the first and second current sensors are each divided into two corresponding sensor fractions with one fraction of each sensor formed on the body portion of the housing and the other corresponding fraction of each sensor formed on the lever portion of the housing, the fractions of the first and second current sensors configured such that each of the first and second current sensors have a central opening dimensioned to receive a terminal of the transformer when the lever portion of the housing is in its first position, and wherein the first and second current sensors are further positioned on the housing such that the meter can be mounted to the terminals of the transformer with the first current sensor receiving one terminal of the transformer and the second current sensor receiving another terminal of the transformer.

18. The meter of claim 17 wherein the first and second voltage leads each comprise a conductive clip mounted on the housing adjacent the first and second current sensors, respectively, the clips each being dimensioned and configured such that each clip electrically contacts the terminal received in the corresponding current sensor opening.

19. The meter of claim 18 wherein the lever portion of the housing is pivotally connected to the body portion of the housing, and further comprising a latch for latching and unlatching the lever member in its first position.

20. A current sensor mountable to a conductor for sensing the current passing through the conductor, the current sensor comprising:

a housing having a central opening, the central opening dimensioned to receive the conductor;

a first and second set of planar coils mounted in the housing, the first and second set of planar coils radiating from the central opening, the planar coils being positioned in substantial radial symmetry about a central axis of the central opening;

said coils being electrically interconnected in the current sensor such that output voltages of said coils are combined and applied to output terminals of said sensor;

the first and second sets of planar coils being electrically interconnected in a first and second circuit, respectively, the first and second set of planar coils being interleaved, the first circuit being coupled to a positive input on a differential amplifier and the second circuit being coupled to a negative input on the differential amplifier.

21. The current sensor of claim 20 wherein the housing has a body portion and a lever portion, the lever portion being movably mounted to the body portion and movable between a closed position wherein the lever portion abuts the body portion and an open position wherein the lever portion is positioned away from the body portion, the central opening being formed between the body and lever portions, some of the first and second set of planar coils being contained in the body portion of the housing and some of the first and second set of planar coils being contained in the lever portion of the housing.

22. The current sensor of claim 21 wherein the lever portion is pivotally connected to the body portion and further comprising a latch mechanism for releasably holding the body and lever portions in their closed position.

23. The current sensor of claim 22 wherein the latch mechanism comprises a magnetic latch having a first magnetic component on the body portion and a second magnetic component on the lever portion.

* * * * *